(12) United States Patent
Kim et al.

(10) Patent No.: US 12,124,126 B2
(45) Date of Patent: Oct. 22, 2024

(54) BACKLIGHT UNIT AND DISPLAY DEVICE INCLUDING THE SAME

(71) Applicant: LG Display Co., Ltd., Seoul (KR)

(72) Inventors: EuiJung Kim, Paju-si (KR); ChangKyeong Kong, Paju-si (KR); HyunCheol Cho, Seoul (KR)

(73) Assignee: LG Display Co., Ltd., Seoul (KR)

(*) Notice: Subject to any disclaimer, the term of this patent is extended or adjusted under 35 U.S.C. 154(b) by 196 days.

(21) Appl. No.: 17/978,802

(22) Filed: Nov. 1, 2022

(65) Prior Publication Data

US 2023/0194922 A1 Jun. 22, 2023

(30) Foreign Application Priority Data

Dec. 17, 2021 (KR) .................. 10-2021-0181295

(51) Int. Cl.
*G02F 1/13357* (2006.01)
*G02F 1/1335* (2006.01)
*H01L 25/075* (2006.01)

(52) U.S. Cl.
CPC .. *G02F 1/133603* (2013.01); *G02F 1/133608* (2013.01); *G02F 1/133612* (2021.01); *G02F 1/133628* (2021.01); *H01L 25/0753* (2013.01)

(58) Field of Classification Search
CPC ......... G02F 1/133603; G02F 1/133608; G02F 1/133612; G02F 1/133628; H01L 25/0753
See application file for complete search history.

(56) References Cited

U.S. PATENT DOCUMENTS

| 11,088,066 B2* | 8/2021 | Sääski | H01L 25/0657 |
| 12,001,101 B2* | 6/2024 | Lee | H01R 12/58 |
| 2023/0170342 A1* | 6/2023 | Kong | H01L 24/05 257/72 |

* cited by examiner

*Primary Examiner* — Tracie Y Green
(74) *Attorney, Agent, or Firm* — Fenwick & West LLP

(57) ABSTRACT

A backlight unit A backlight unit comprises first and second glass substrates, a resin layer between the first and second glass substrates, light sources on the first and second glass substrates, first and second transistors on the first and second glass substrates and electrically connected with the light sources, and spaced apart from each other, first conductive layers on a portion of an upper surface of the first glass substrate, second conductive layers on a portion of an upper surface of the second glass substrate, and third conductive layers on the first glass substrate, the second glass substrate, and the resin layer, wherein one of the third conductive layers is electrically connected with one of the first conductive layers and one of the second conductive layers and is on a portion of an upper surface of the resin layer.

10 Claims, 26 Drawing Sheets

BACKLIGHT UNIT AND DISPLAY DEVICE INCLUDING THE SAME

CROSS-REFERENCE TO RELATED APPLICATION

This application claims priority from Republic of Korea Patent Application No. 10-2021-0181295, filed on Dec. 17, 2021, which is hereby incorporated by reference in its entirety.

BACKGROUND

Field

Embodiments of the disclosure relate to a backlight unit and a display device including the same.

Description of Related Art

A display device may include a display panel with multiple subpixels and various driving circuits for driving the elements disposed in the subpixels. Depending on the type of the display device, the display device may include a backlight unit for supplying light to the display panel.

The backlight unit may include a plurality of light sources and a plurality of optical members. The backlight unit may be disposed on the surface opposite to the surface where the display panel displays images to supply light to the display panel.

SUMMARY

Embodiments of the disclosure relate to a backlight unit enhancing image quality by including light sources disposed, at a high density, on a glass substrate, and a display device including the same.

Embodiments of the disclosure relate to a backlight unit having a structure in which a plurality of transistors drive a plurality of light sources to reduce manufacturing costs, and a display device including the same.

Embodiments of the disclosure relate to a backlight unit capable of supplying light through a plurality of light sources disposed on a plurality of glass substrates to a large-area display panel, and a display device including the same.

Embodiments of the disclosure relate to a backlight unit having a structure capable of enhancing the rigidity of a cover bottom of the backlight unit including a glass substrate on which a plurality of light sources are disposed, and a display device including the same.

Embodiments of the disclosure may provide a backlight unit comprising a first glass substrate and a second glass substrate disposed to be spaced apart from the first glass substrate, a resin layer disposed between the first glass substrate and the second glass substrate, a plurality of light sources disposed on the first and second glass substrates, a first transistor and a second transistor disposed on the first and second glass substrates, electrically connected with the plurality of light sources, and spaced apart from each other, a plurality of first conductive layers disposed on a portion of an upper surface of the first glass substrate, a plurality of second conductive layers disposed on a portion of an upper surface of the second glass substrate, and a plurality of third conductive layers disposed on the first glass substrate, the second glass substrate, and the resin layer, wherein one of the plurality of third conductive layers is electrically connected with one of the plurality of first conductive layers and one of the plurality of second conductive layers and is disposed on a portion of an upper surface of the resin layer and a display device including the same.

Embodiments of the disclosure may provide a backlight unit comprising sub glass substrates, a plurality of light sources disposed on each of the sub glass substrates, a first transistor and a second transistor disposed on each of the sub glass substrates, electrically connected with the plurality of light sources, and spaced apart from each other, a first foam pad disposed on a rear surface of each of the sub glass substrates, and a substrate set including a plate disposed on a rear surface of the first foam pad and the sub glass substrates and having a plurality of holes and a display device including the same.

According to embodiments of the disclosure, there may be provided a backlight unit enhancing image quality by including light sources disposed, at a high density, on a glass substrate, and a display device including the same.

According to embodiments of the disclosure, there may be provided a backlight unit having a structure in which a plurality of transistors drive a plurality of light sources to reduce manufacturing costs, and a display device including the same.

According to embodiments of the disclosure, there may be provided a backlight unit capable of supplying light through a plurality of light sources disposed on a plurality of glass substrates to a large-area display panel, and a display device including the same.

According to embodiments of the disclosure, there may be provided a backlight unit having a structure capable of enhancing the rigidity of a cover bottom by including a glass substrate on which a plurality of light sources are disposed and reducing the number of holes in the cover bottom through which a circuit film connected to the glass substrate is passed, and a display device including the same.

BRIEF DESCRIPTION OF DRAWINGS

The above and other objects, features, and advantages of the disclosure will be more clearly understood from the following detailed description, taken in conjunction with the accompanying drawings, in which.

DETAILED DESCRIPTION

Figure 1:
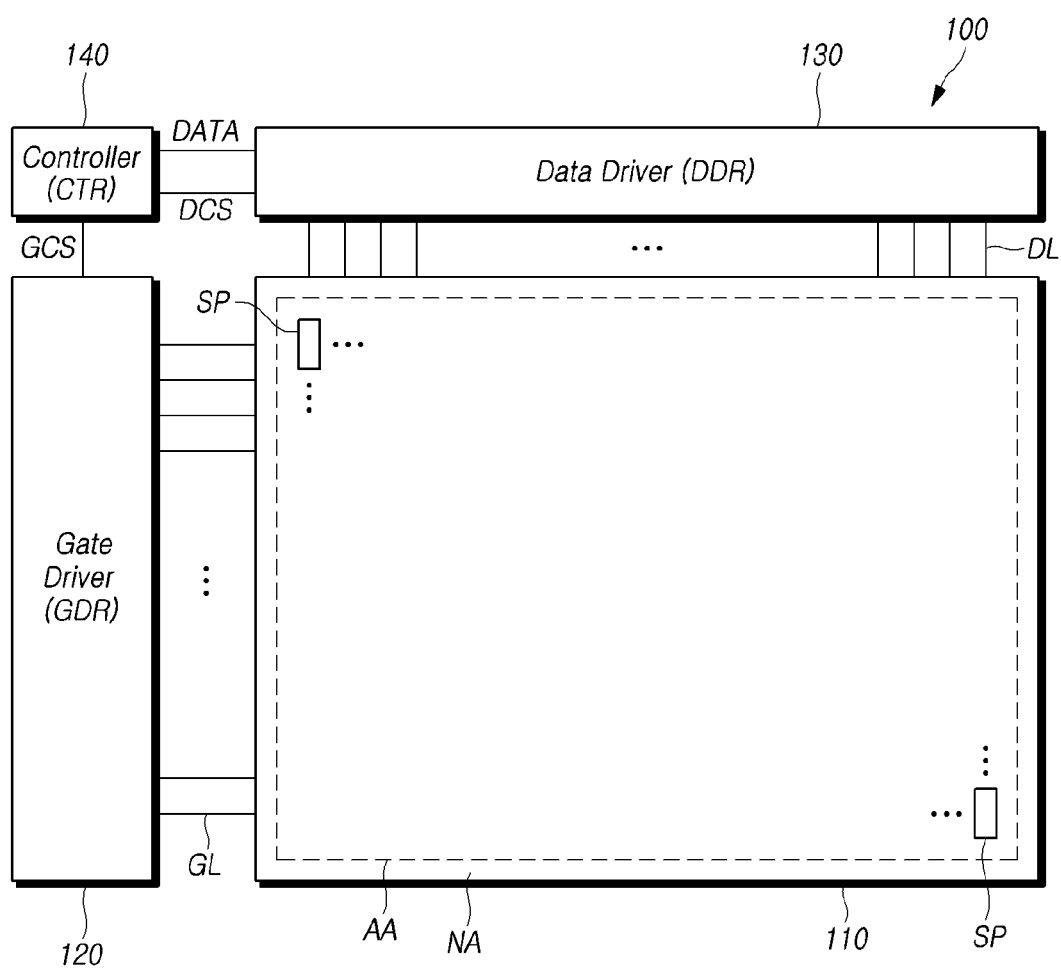
FIG. 1 is a view schematically illustrating a configuration of a display device according to various embodiments of the disclosure.

In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the disclosure, detailed descriptions of well-known functions and components incorporated herein will be omitted when it is determined that the description may make the subject matter in some embodiments of the disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can.

Hereinafter, various embodiments of the disclosure are described in detail with reference to the accompanying drawings.

FIG. 1 is a view schematically illustrating a configuration of a display device 100 according to various embodiments of the disclosure.

Referring to FIG. 1, a display device 100 may include a display panel 110 including an active area AA and a non-active area NA, a gate driving circuit 120, a data driving circuit 130, and a controller 140 for driving the display panel 110.

The display panel 110 may include a plurality of gate lines GL, a plurality of data lines DL, and subpixels SP at the crossings of the gate lines GL and the data lines DL.

The gate driving circuit 120 may be controlled by the controller 140 to sequentially output scan signals to the plurality of gate lines GL disposed in the display panel 110, controlling the driving timing of the subpixels SP.

The gate driving circuit 120 may include one or more gate driver integrated circuits (GDICs). Depending on driving schemes, the gate driving circuit 120 may be positioned on only one side, or each of two opposite sides, of the display panel 110.

Each gate driver integrated circuit (GDIC) may be connected to the bonding pad of the display panel 110 in a tape automated bonding (TAB) or chip-on-glass (COG) scheme or may be implemented in a gate-in-panel (GIP) type to be directly disposed in the display panel 110 or, in some cases, may be integrated in the display panel 110. Each gate driver integrated circuit (GDIC) may also be implemented in a chip-on-film (COF) scheme to be mounted on a film connected to the display panel 110.

The data driving circuit 130 receives image data from the controller 140 and converts the image data into an analog data voltage. The data driving circuit 130 outputs a data voltage to each data line DL according to the timing of applying a scan signal via the gate line GL, allowing each subpixel SP to represent a brightness according to the image data.

The data driving circuit 130 may include one or more source driver integrated circuits (SDICs).

Each source driver integrated circuit (SDIC) may include, e.g., shift registers, latch circuits, digital-analog converters, and output buffers.

Each source driver integrated circuit (SDIC) may be connected to the bonding pad of the display panel 110 in a TAB or COG scheme or may be directly disposed in the display panel 110 or, in some cases, may be integrated in the display panel 110. Each source driver integrated circuit (SDIC) may be implemented in a COF scheme in which case each source driver integrated circuit (SDIC) may be mounted on a film connected to the display panel 110 and be electrically connected with the display panel 110 via wires on the film.

The controller 140 supplies various control signals to the gate driving circuit 120 and the data driving circuit 130 and controls the operation of the gate driving circuit 120 and the data driving circuit 130.

The controller 140 may be mounted on a printed circuit board or a flexible printed circuit and may be electrically connected with the gate driving circuit 120 and the data driving circuit 130 through the printed circuit board or the flexible printed circuit.

The controller 140 enables the gate driving circuit 120 to output scan signals according to the timing of implementing each frame, converts image data received from the outside to meet the data signal format used by the data driving circuit 130, and outputs the resultant image data to the data driving circuit 130.

The controller 140 receives, from the outside (e.g., a host system) the display device 100, various timing signals including a vertical synchronization signal VSYNC, a horizontal synchronization signal HSYNC, an input data enable signal DE, and a clock signal, along with the image data.

The controller 140 may generate a diversity of control signals using the timing signals received from the outside and output the control signals to the gate driving circuit 120 and the data driving circuit 130.

As an example, to control the gate driving circuit 120, the controller 140 outputs various gate control signals GCS including a gate start pulse GSP, a gate shift clock GSC, and a gate output enable signal GOE.

The gate start pulse GSP controls the operation start timing of one or more gate driver integrated circuits GDICs constituting the gate driving circuit 120. The gate shift clock GSC is a clock signal commonly input to one or more gate driver integrated circuits GDICs and controls the shift timing of the scan signals. The gate output enable signal GOE designates timing information about one or more gate driver integrated circuits GDICs.

To control the data driving circuit 130, the controller 140 outputs various data control signals DCS including, e.g., a source start pulse SSP, a source sampling clock SSC, and a source output enable signal SOE.

The source start pulse SSP controls the data sampling start timing of one or more source driver integrated circuits SDICs constituting the data driving circuit 130. The source sampling clock SSC is a clock signal for controlling the sampling timing of data in each source driver integrated circuit (SDIC). The source output enable signal SOE controls the output timing of the data driving circuit 130.

The controller 140 may individually control the luminance of each area of the display panel 110 by controlling the light emitting operation of the backlight unit of the display device 100 through the local dimming technology.

The display device 100 may further include a power management integrated circuit that supplies various voltages or currents to, e.g., the display panel 110, the gate driving circuit 120, and the data driving circuit 130 or controls various voltages or currents to be supplied.

Each subpixel SP may be an area defined by the crossing of the gate line GL and the data line DL, and liquid crystals or a light emitting element may be disposed in each subpixel SP depending on the type of the display device 100.

As an example, when the display device 100 is a liquid crystal display device, the display device 100 may include a light source device, such as a backlight unit, to emit light to the display panel 110. Liquid crystals are disposed in the subpixel SP of the display panel 110. The alignment of liquid crystals may be adjusted by an electric field created as data voltage is applied to each subpixel SP, thereby representing a brightness per image data and displaying an image.

Figure 2:
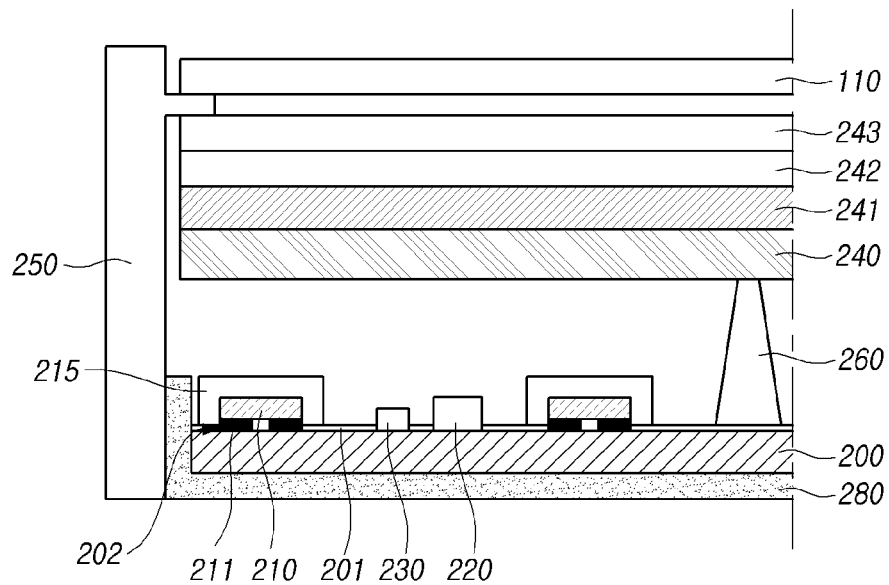
FIG. 2 is a view illustrating a cross-sectional structure of a display device according to embodiments of the disclosure.

FIG. 2 is a view illustrating a cross-sectional structure of a display device according to embodiments of the disclosure.

Referring to FIG. 2, the display device 100 may include a display panel 110 and a backlight unit disposed under the display panel 110 and supplying light to the display panel 110.

The backlight unit may include a light source 210, a first transistor 220, and a second transistor 230 disposed on a substrate 200.

At least one reflective layer 201 may be disposed on the substrate 200.

The reflective layer 201 may include a highly reflective material (e.g., TiOx) and may be formed of white ink or may be in the form of a film, but embodiments of the disclosure are not limited thereto.

The reflective layer 201 may reflect the light emitted from the light source 210 to convert the path of the light toward the display panel 110, thereby enhancing the luminous efficiency of the backlight unit.

The reflective layer 201 may have a plurality of holes 202.

A light source 210 may be disposed in each of the plurality of holes 202.

A solder pattern 211 to which the signal for driving the light source 210 is applied may be disposed under a light source 210 emitting light.

The light source 210 may be, e.g., a light emitting diode (LED) or a mini LED or a micro LED (μLED). Accordingly, the light source 210 in the form of a chip may be disposed to be mounted on the printed circuit 230, thereby reducing the thickness of the backlight unit.

The light source 210 may emit blue light. Blue light may be excited through an optical member disposed on the light source 210 to supply white light to the display panel 110.

However, embodiments of the disclosure are not limited thereto, and in some cases, the light source 210 may be a light source that emits white light or a light source that emits light in a specific wavelength band other than white and blue.

Although not shown in FIG. 2, the solder pattern 211 may be disposed on the substrate 200.

The solder pattern 211 may be disposed in an area corresponding to the hole 202 of the reflective layer 201. As the reflective layer 201 serves as a wall, preventing the solder pattern 211 from penetrating into other areas beyond the area where the light source 210 is disposed.

In other words, as the reflective layer 201 is disposed on the substrate 200 in an area except for the area where the light source 210 is disposed, the light efficiency of the backlight unit may be enhanced.

Each light source 210 may be surrounded by a light source protection portion 215.

The light source protection portion 215 may be formed of, e.g., resin.

As illustrated in FIG. 2, the light source protection portion 215 may be disposed on the reflective layer 201.

However, the structure of the backlight unit according to embodiments of the disclosure is not limited thereto, and the light source protection portion 215 may be disposed inside the hole 202 of the reflective layer 201.

The light source protection portion 215 may protect the light source 210 and may provide a function of diffusing the light emitted from the light source 210.

A plurality of first transistors 220 and a plurality of second transistors 230 may be disposed on the substrate 200.

Each of the first transistors 220 and the second transistors 230 may be disposed inside a respective hole 202 of the reflective layer 201.

The first transistor 220 may be a driving transistor that controls driving of the light source 210. The second transistor 230 may be a switching transistor (or a scan transistor) that controls the timing of the first transistor 220.

As the first and second transistors 220 and 230 are disposed on the substrate 200 on which the light source 210 is disposed, at least one light emitting element may be implemented.

For example, the first and second transistors 220 and 230 may drive at least four light sources 210.

Since the display device according to embodiments of the disclosure implements the transistor on the substrate 200 on which the light source 210 is disposed, the electrode structure of the light source 210 is not limited to a vertical type or a flip type, so that the light source 210 may be more easily formed.

A diffusion plate supporting member 260 may be disposed on the substrate 200.

The diffusion plate supporting member 260 may serve to support a diffusion plate 240 disposed on the light source 210, the first transistor 220, and the second transistor 230.

A color conversion sheet 241 for changing the wavelength band of the light emitted from the light source 210 may be disposed on the diffusion plate 240.

A plurality of optical sheets may be disposed on the color conversion sheet 241.

The optical sheet may include a prism sheet 242 disposed on the color conversion sheet 241 and a diffusion sheet 243 disposed on the prism sheet 242.

The positions where the diffusion plate 240 and the color conversion sheet 241 are disposed may be interchanged.

The diffusion plate 240 may serve to diffuse the light emitted from the light source 210.

The color conversion sheet 241 may emit light of a specific wavelength band in response to incident light.

For example, when the light source 210 emits light (e.g., blue light) of a first wavelength band, the color conversion sheet 241 may react to incident light, emitting light (e.g., green light) of a second wavelength band) and light (e.g., red light) of a third wavelength. Accordingly, light of a white wavelength band may be supplied to the display panel 110 through the color conversion sheet 241.

In some cases, the color conversion sheet 241 may be disposed in a partial area on the diffusion plate 240.

A cover bottom 280 surrounding the substrate 200 may be disposed under the substrate 200.

A guide panel 250 may be disposed to correspond to the side surfaces of the substrate 200, the diffusion plate 240, the color conversion sheet 241, and the optical sheets 242 and 243.

A portion of the guide panel 250 may be disposed under the display panel 110 to support the display panel 110.

Figure 3:
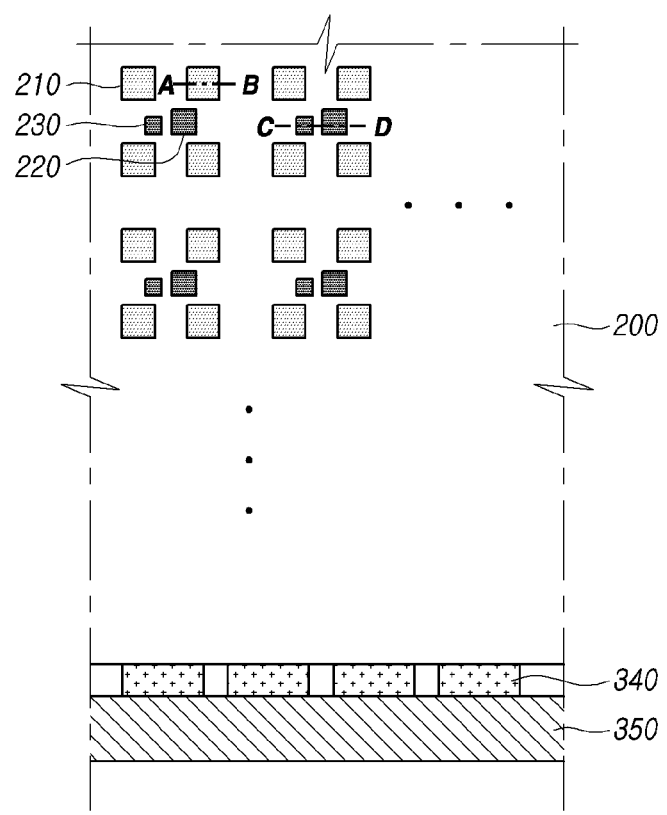
FIG. 3 is a schematically illustrating a structure of a substrate on which a light source included in a backlight unit of a display device and a transistor for driving the light source are disposed according to embodiments of the disclosure.

FIG. 3 is a schematically illustrating a structure of a substrate on which a light source included in a backlight unit of a display device and a transistor for driving the light source are disposed according to embodiments of the disclosure.

Referring to FIG. 3, a plurality of light sources 210 and first transistors 220 and second transistors 230 for driving the plurality of light sources 210 may be disposed on a substrate 200.

The substrate 200 may be a glass substrate, but is not limited thereto.

The plurality of light sources 210 disposed on the substrate 200 may be disposed to be spaced apart from each other.

The plurality of light sources 210 may be disposed in a plurality of rows and a plurality of columns.

For example, the plurality of light sources 210 may be disposed in odd-numbered rows and odd-numbered columns.

The first transistors 220 and the second transistors 230 may be disposed in even-numbered rows and even-numbered columns.

However, this is merely an example, and the plurality of light sources 210 may be disposed in even-numbered rows and even-numbered columns, and the first and second transistors 220 and 230 may be disposed in odd-numbered rows and odd-numbered columns.

Each of the first transistor 220 and the second transistor 230 disposed to be spaced apart from each other may be used to drive the plurality of light sources 210.

For example, one first transistor 220 and one second transistor 230 may be used to drive four light sources 210.

In other words, four light sources 210 may be electrically connected to one first transistor 220 and one second transistor 230.

One first transistor 220 and one second transistor 230 may be electrically connected to the two light sources 210 disposed in the first row and the first column and the two light sources 210 disposed in the first row and the second column.

One first transistor 220 and one second transistor 230 may be disposed between two light sources 210 disposed in each row.

Specifically, each of one first transistor 220 and one second transistor 230 may be disposed between two light sources 210 disposed in two adjacent rows and may be disposed between two light sources 210 disposed in two adjacent columns.

In other words, each of one first transistor 220 and one second transistor 230 may be disposed not to overlap the plurality of light sources 210 disposed at the intersection of two rows and two columns.

Although not shown in FIG. 3, a plurality of lines for electrically connecting the first transistor 220, the second transistor 230, and the plurality of light sources 210 may be disposed on the substrate 200.

A circuit board 350 necessary for driving the first and second transistors 220 and 230 may be disposed on at least one side of the substrate 200.

The circuit board 350 may be connected to the substrate 200 through a plurality of circuit films 340.

Although not shown in the drawings, a plurality of lines electrically connected to the plurality of first transistors 220 and the plurality of second transistors 230 may be disposed on the plurality of circuit films 340.

The first transistor 220 and the second transistor 230 disposed on the substrate 200 may be electrically connected to a plurality of lines electrically connected to the circuit board 350.

The structure of the substrate 200 of the backlight unit according to embodiments of the disclosure is described below in greater detail.

Figure 4:
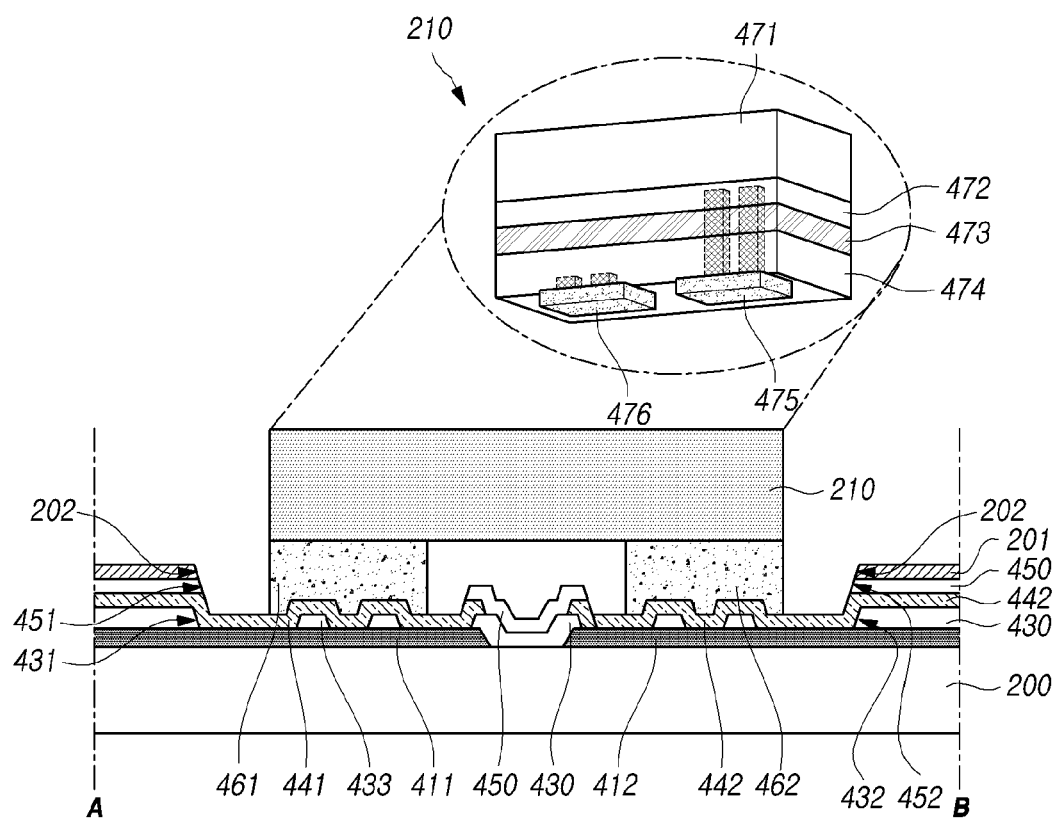
FIG. 4 is a cross-sectional view taken along line A-B of FIG. 3 according to embodiments of the disclosure.

FIG. 4 is a cross-sectional view taken along line A-B of FIG. 3 according to one embodiment.

Substantially the same configurations and effects as those described above are not repeatedly described below. In the following description, the same reference numbers may be used to denote the same elements or components as those described in the above embodiments.

Referring to FIG. 4, a first pad electrode 411 and a second pad electrode 412 spaced apart from each other may be disposed on the substrate 200 of the backlight unit according to embodiments of the disclosure.

The first pad electrode 411 and the second pad electrode 412 may be electrically connected to the circuit board 350 through the circuit film 340 connected to one side of the substrate 200 illustrated in FIG. 3.

Although not shown in FIG. 4, at least one insulation layer may be disposed between the substrate 200 and the first pad electrode 411 and the second pad electrode 412.

At least one insulation layer 430 may be disposed on the first pad electrode 411 and the second pad electrode 412. For example, a first insulation layer 430 may be disposed on the first pad electrode 411 and the second pad electrode 412.

The first insulation layer 430 may include an inorganic insulating material. For example, the first insulation layer 430 may include at least one of silicon nitride (SiNx), silicon oxide (SiOx), or silicon oxynitride (SiON), but embodiments of the disclosure are limited thereto.

The first insulation layer 430 may include a plurality of holes 431 and 432,

The holes 431 and 432 of the first insulation layer 430 may be formed to expose a portion of the upper surface of each of the first pad electrode 411 and the second pad electrode 412.

A first insulation layer pattern 433 may be disposed on the portion of the upper surface of each of the first and second pad electrodes 411 and 412, exposed by the first insulation layer 430.

When a plurality of first insulation layer patterns 433 are disposed on the portion of the upper surface of each of the first and second pad electrodes 411 and 412, the patterns may be spaced apart from each other.

A third pad electrode 441 and a fourth pad electrode 442 spaced apart from each other may be disposed on the substrate 200 on which the first insulation layer 430 and the first insulation layer pattern 433 are disposed.

In the area corresponding to the first and second holes 431 and 432 of the first insulation layer 430, the third pad electrode 441 and the fourth pad electrode 442 may include a protruding portion, rather than being formed to be flat, by the first insulation layer pattern 433.

The third pad electrode 441 and the fourth pad electrode 442 may include any one of metals, such as aluminum (Al), gold (Au), silver (Ag), copper (Cu), tungsten (W), molybdenum (Mo), chromium (Cr), tantalum (Ta), and titanium (Ti), or alloys thereof, but the disclosure is not limited thereto.

The third pad electrode 441 and the fourth pad electrode 442 may be disposed along the holes 431 and 432 of the first insulation layer 430.

Specifically, the third pad electrode 441 may be disposed on the first pad electrode 411, and the fourth pad electrode 442 may be disposed on the second pad electrode 412.

The third pad electrode 441 may contact the first pad electrode 411 in an area corresponding to the first hole 421 of the first insulation layer 430.

The fourth pad electrode 442 may contact the second pad electrode 412 in an area corresponding to the second hole 422 of the first insulation layer 430.

A second insulation layer 450 including one or more layers may be disposed on portions of the upper surfaces of the third and fourth pads 441 and 442.

The second insulation layer 450 may include an inorganic insulating material. For example, the second insulation layer 450 may include at least one of silicon nitride (SiNx), silicon oxide (SiOx), or silicon oxynitride (SiON), but embodiments of the disclosure are limited thereto.

The second insulation layer 450 may include at least one hole 451 and 452,

The holes 451 and 452 of the second insulation layer 450 may be formed to expose a portion of the upper surface of each of the third pad electrode 441 and the fourth pad electrode 442.

Specifically, the third hole 451 of the second insulation layer 450 may expose the upper surface of the third pad electrode 441 in the area where the third pad electrode 441 contacts the first pad electrode 411.

The fourth hole 451 of the second insulation layer 450 may expose the upper surface of the fourth pad electrode 442 in the area where the fourth pad electrode 442 contacts the second pad electrode 412.

A reflective layer 201 may be disposed on at least a portion of the upper surface of the third insulation layer 450.

The reflective layer 201 may include a hole 202. The hole 202 of the reflective layer 201 may overlap the first to fourth holes 431, 432, 451, and 452 of the first and second insulation layers 430 and 450.

In the area where the first hole 431 and the third hole 451 of the first and second insulation layers 430 and 450 overlap the hole 202 of the reflective layer 201, a first solder pattern 461 may be disposed on the third pad electrode 441.

In the area where the second hole 432 and the fourth hole 451 of the first and second insulation layers 430 and 450 overlap the hole 202 of the reflective layer 201, a second solder pattern 462 may be disposed on the fourth pad electrode 442.

The first and second solder patterns 461 and 462 may contact and electrically connect to the third and fourth pad electrodes 441 and 442.

The first and second solder patterns 461 and 462 may contact protruding portions of the third and fourth pad electrodes 441 and 442, respectively, so that the adhesion between the first solder pattern 461 and the third pad electrode 441 may be enhanced, and the adhesion between the second solder pattern 462 and the fourth pad electrode 442 may be enhanced.

A light source 210 may be disposed on the first solder pattern 461 and the second solder pattern 462.

As illustrated in FIG. 4, the light source 210 may include a light source substrate 271, an n-type semiconductor layer 472, an active layer 473, a p-type semiconductor layer 475, a first electrode 475, and a second electrode 476.

The light source substrate 271 may be formed of at least one of $Al_2O_3$, SiC, Si, GaAs, GaN, ZnO, GaP, InP, and Ge.

The n-type semiconductor layer 472 may be a semiconductor layer doped with a first conductivity-type dopant. The n-type semiconductor layer 472 may be formed of at least one of GaN, InN, AlN, InGaN, AlGaN, and InAlGaN. The first conductivity-type dopant of the n-type semiconductor layer 472 may include one or more of Si, Ge, Sn, Se, and Te, which are n-type dopants.

The active layer 473 may be formed in a single quantum well or multiple quantum well (MQW) structure. In other words, the active layer 473 may be formed of at least one of GaN, InN, AlN, InGaN, AlGaN, and InAlGaN using a Group III-5 compound semiconductor material.

For example, the active layer 473 may have a structure in which InGaN well layers/GaN barrier layers are alternately formed. The active layer 473 may generate light while the carriers supplied from the n-type semiconductor layer 472 and the carriers supplied from the p-type semiconductor layer 474 recombine.

The carriers supplied from the n-type semiconductor layer 472 may be electrons. The carriers supplied from the p-type semiconductor layer 474 may be holes.

The p-type semiconductor layer 474 may include a semiconductor layer doped with a second conductivity-type dopant, and may be formed as a single layer or multiple layers.

The p-type semiconductor layer 474 may be formed of at least one of GaN, InN, AlN, InGaN, AlGaN, and InAlGaN. The second conductivity-type dopant may include one or more of Mg, Zn, Ca, Sr, and Ba, which are p-type dopants.

The first electrode 475 of the light source 210 may be electrically connected to the n-type semiconductor layer 472. The first electrode 475 may be an n-type electrode.

The second electrode 476 of the light source 210 may be electrically connected to the p-type semiconductor layer 474. The second electrode 476 may be a p-type electrode.

The first electrode 475 and the second electrode 476 of the light source 210 may be connected to the bonding pad 212.

The light source 210 having the above-described structure may be driven through the first transistor and the second transistor, as described above with reference to FIG. 3.

The structure of the first and second transistors will be reviewed as follows.

Figure 5:
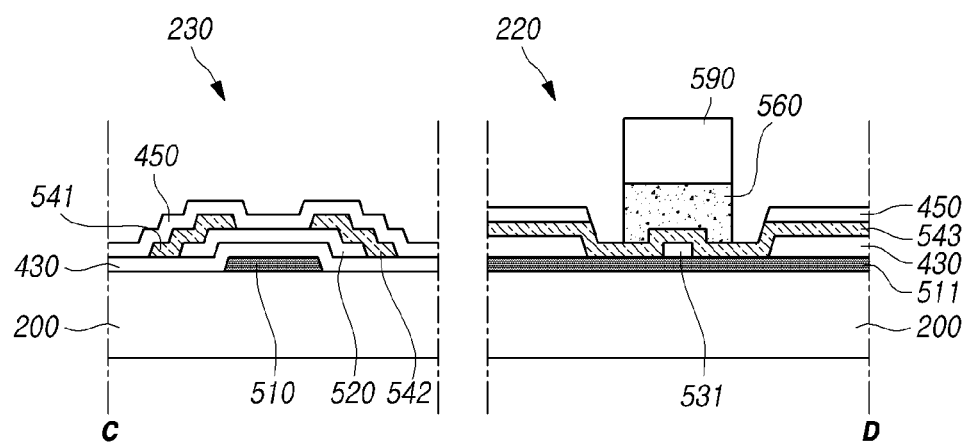
FIG. 5 is a cross-sectional view taken along line C-D of FIG. 3 according to embodiments of the disclosure.

FIG. 5 is a cross-sectional view taken along line C-D of FIG. 3 according to one embodiment.

Substantially the same configurations and effects as those described above are not repeatedly described below. In the following description, the same reference numbers may be used to denote the same elements or components as those described in the above embodiments.

At least one first transistor 220 and at least one second transistor 230 may be disposed on the substrate 200.

The first transistor 220 may correspond to the semiconductor chip 590.

A first semiconductor chip pad electrode 511 may be disposed on the substrate 200, and a first insulation layer 430 may be disposed on the first semiconductor chip pad electrode 511.

The first semiconductor chip pad electrode 511 may be disposed on the same layer as the first and second pad electrodes 411 and 412 of FIG. 4 and may contain the same material.

The first insulation layer 430 may include a hole exposing a portion of the upper surface of the first semiconductor chip pad electrode 511.

At least one first insulation layer pattern 531 may be disposed on a portion of the upper surface of the first semiconductor chip pad electrode 511 in an area corresponding to the hole of the first insulation layer 430.

A second semiconductor chip pad electrode 543 may be disposed on the first insulation layer 430 and the first insulation layer pattern 531.

In an area corresponding to the hole of the first insulation layer 430, the second semiconductor chip pad electrode 543 may include at least one protruding portion due to the first insulation layer pattern 531.

In other words, as the second semiconductor chip pad electrode 543 is disposed on the first insulation layer pattern 531, the morphology of the second semiconductor chip pad electrode 543 may be formed along the first insulation layer pattern 531.

The second semiconductor chip pad electrode 543 may be disposed on the same layer as the third and fourth pad electrodes 441 and 442 of FIG. 4 and may contain the same material.

The second semiconductor chip pad electrode 543 may be disposed along the hole of the first insulation layer 430. The second semiconductor chip pad electrode 543 may contact the first semiconductor chip pad electrode 511 in an area overlapping the hole of the first insulation layer 430.

A second insulation layer 450 may be disposed on a portion of the upper surface of the second semiconductor chip pad electrode 543.

The second insulation layer 450 may include a hole overlapping the hole of the first insulation layer 430.

The hole of the second insulation layer 450 may expose the upper surface of the second semiconductor chip pad electrode 543 in an area where the second semiconductor chip pad electrode 543 and the first semiconductor chip pad electrode 511 contact each other.

Although not shown in the drawings, a reflective layer may be further disposed on the second insulation layer 450.

A solder pattern 560 and a semiconductor chip 590 may be disposed on the second semiconductor chip pad electrode 543 in an area overlapping the respective holes of the first and second insulation layers 430 and 450.

Although FIG. 5 illustrates a structure in which one solder pattern 560 is disposed under one semiconductor chip 590, a plurality of solder patterns 560 may be disposed under one semiconductor chip 590.

The semiconductor chip 590 may be a MOSFET. For example, the semiconductor chip 590 may be an NMOSFET or a PMOSFET.

The second transistor 230 may include a gate electrode 510, an active layer 510, a source electrode 541, and a drain electrode 542.

Specifically, the gate electrode 510 may be disposed on the substrate 200.

The gate electrode 510 may be disposed on the same layer as the first semiconductor chip pad electrode 511 and may contain the same material.

A first insulation film 430 may be disposed on the gate electrode 510.

An active layer 520 may be disposed on the first insulation layer 430. The active layer 520 may be formed of an a-Si semiconductor.

The source electrode 541 and the drain electrode 542 spaced apart from each other may be disposed on the active layer 520 and the first insulation layer 430.

Each of the source electrode 541 and the drain electrode 542 may be disposed on the same layer as the second semiconductor chip pad electrode 543 and may be formed of the same material.

A structure in which 541 is the source electrode and 542 is the drain electrode has been described with reference to FIG. 5, but 541 may be the drain electrode and 542 may be the source electrode.

One of the source electrode 541 or the drain electrode 542 may be electrically connected to the third pad electrode 441 or the fourth pad electrode 442 of FIG. 4.

A second insulation layer 450 may be disposed on the source electrode 541 and the drain electrode 542.

As mentioned above, a plurality of light sources (e.g., four light sources), the first transistor 220 and the second transistor 230 may be electrically connected.

For example, the third and fourth pad electrodes 441 and 442 disposed under the first and second solder patterns 461 and 462 may be electrically connected to the first and second transistors 220 and 230.

This is described below with reference to FIG. 6.

Figure 6:
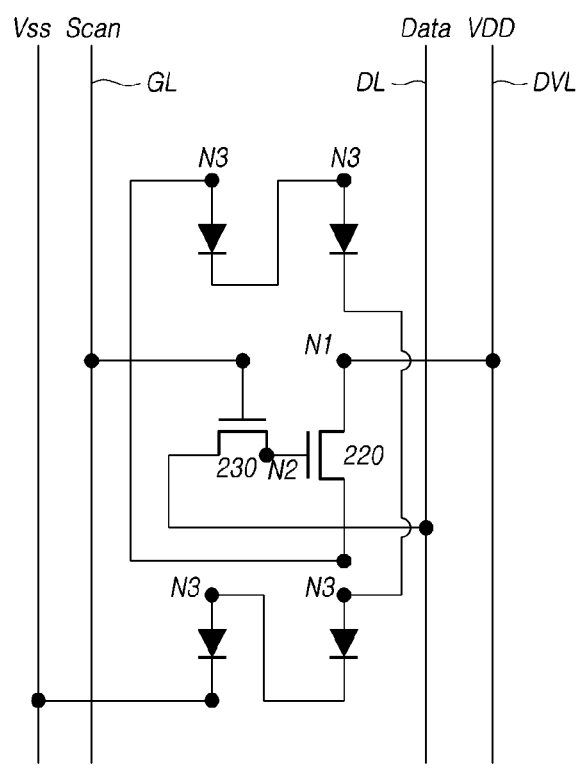
FIG. 6 is a view illustrating an example of a circuit structure of a backlight unit included in a display device according to embodiments of the disclosure.

FIG. 6 is a view illustrating an example of a circuit structure of a backlight unit included in a display device according to embodiments of the disclosure.

Referring to FIG. 6, a backlight unit included in a display device according to embodiments of the disclosure may include a light source and a first transistor 220 and a second transistor 230 for driving the light source.

The first transistor 220 may control driving of the light source and may have a first node N1, a second node N2, and a third node N3.

The first node N1 of the first transistor 220 may be electrically connected to the driving voltage line DVL to which the driving voltage Vdd is applied, and may be a drain node or source node.

The second node N2 of the first transistor 220 may be electrically connected to the second transistor 230 and a storage capacitor (not shown), and may be a gate node.

The third node N3 of the first transistor 220 may be electrically connected to the light source and may be a source node or a drain node.

The first transistor 220 may have a plurality of third nodes N3. For example, the first transistor 220 may have four third nodes N3.

The second transistor 230 operates according to a scan signal applied through the gate line GL and controls the operation timing of the first transistor 220.

The storage capacitor (not shown) may maintain the data voltage Vdata applied to the second node N2 for one frame.

The light source may have an anode electrode and a cathode electrode, and the anode electrode may be electrically connected to the third node N3 of the first transistor 220, and a base voltage Vss may be applied to the cathode electrode.

Although this structure is described as having an nMOS type as an example, the structure may be of a pMOS type.

A structure in which the first transistor 220 and the second transistor 230 drive four light sources has been described with reference to FIGS. 4 and 6, but embodiments of the disclosure are not limited thereto.

For example, three transistors may drive multiple light sources.

The backlight unit of the display device according to embodiments of the disclosure may have a structure including a plurality of glass substrates.

This is described below with reference to FIG. 7.

Figure 7:
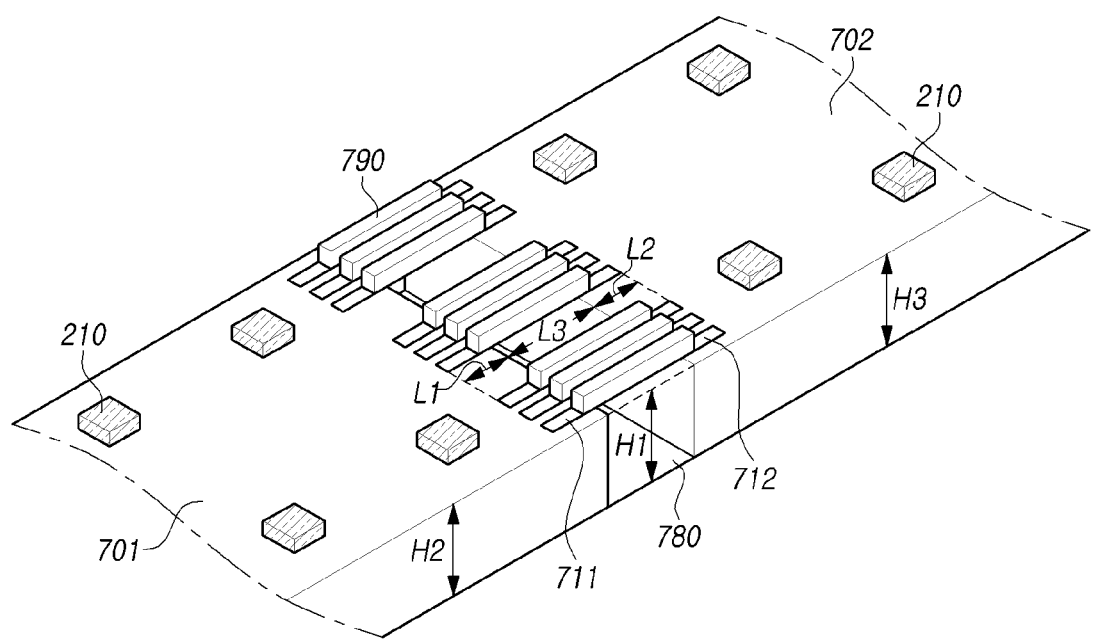
FIG. 7 is a view schematically illustrating a structure in which a plurality of substrates on which a plurality of light sources are disposed are included in a backlight unit included in a display device according to embodiments of the disclosure.

FIG. 7 is a view schematically illustrating a structure in which a plurality of substrates on which a plurality of light sources are disposed are included in a backlight unit included in a display device according to embodiments of the disclosure.

Substantially the same configurations and effects as those described above are not repeatedly described below. In the following description, the same reference numbers may be used to denote the same elements or components as those described in the above embodiments.

Referring to FIG. 7, the backlight unit of the display device according to embodiments of the disclosure may include at least two glass substrates 701 and 702.

For example, the backlight unit may include a first substrate 701 and a second substrate 702.

A plurality of light sources 210 may be disposed on each of the first and second substrates 701 and 702 to be spaced apart from each other.

Although not shown in FIG. 7, the first transistor 220 and the second transistor 230 as shown in FIG. 3 may be disposed on each of the first and second substrates 701 and 702 to drive the plurality of light sources 210.

Referring to FIG. 7, a resin layer 780 may be disposed between the first substrate 701 and the second substrate 702, so that one side of the first substrate 701 and one side of the second substrate 702 may be connected.

The height H1 of the resin layer 780 may correspond to the height H2 of the first substrate 701 and the height H3 of the second substrate 702.

The height H1 of the resin layer 780, the height H2 of the first substrate 701, and the height H3 of the second substrate 702 may be a length in a direction corresponding to the direction in which the light source 210 is stacked on each substrate 701 and 702.

A plurality of first conductive layers 711 may be disposed on a portion of the upper surface of the first substrate 701, and a plurality of second conductive layers 712 may be disposed on a portion of the upper surface of the second substrate 702.

Specifically, as illustrated in FIG. 7, the plurality of first conductive layers 711 may be disposed at the periphery of the first substrate 701. The plurality of second conductive layers 712 may be disposed at the periphery of the second substrate 702.

The first conductive layer 711 disposed on the first substrate 701 may be disposed in an area adjacent to the second substrate 702. The first conductive layer 711 disposed on the second substrate 702 may be disposed in an area adjacent to the first substrate 701.

The plurality of first conductive layers 711 disposed on the first substrate 701 may be disposed to be spaced apart from each other. The plurality of second conductive layers 712 disposed on the second substrate 702 may be disposed to be spaced apart from each other.

The plurality of first conductive layers 711 disposed on the first substrate 701 and the plurality of second conductive layers 712 disposed on the second substrate 702 may be spaced apart from each other, with the resin layer 780 interposed therebetween.

The number of the plurality of first conductive layers 711 disposed on the first substrate 701 and the number of the plurality of second conductive layers 712 disposed on the second substrate 702 may correspond to each other, but embodiments of the disclosure are not limited thereto.

The plurality of first conductive layers 711 and the plurality of second conductive layers 712 may be configured as multiple layers.

For example, when the first conductive layer 711 and the second conductive layer 712 have a double-layer structure, each layer included in each of the conductive layers may include any one of metals, such as aluminum (Al), gold (Au), silver (Ag), copper (Cu), tungsten (W), molybdenum (Mo), chromium (Cr), tantalum (Ta), and titanium (Ti), or alloys thereof, but the disclosure is not limited thereto.

When the first conductive layer 711 and the second conductive layer 712 have a double-layer structure, at least one layer of the layers included in each conductive layer may include any one of indium tin oxide (ITO), indium zinc oxide (IZO), and indium gallium zinc oxide (IGZO), and the other may include any one of metals, such as aluminum (Al), gold (Au), silver (Ag), copper (Cu), tungsten (W), molybdenum (Mo), chromium (Cr), tantalum (Ta), and titanium (Ti), or alloys thereof, but the disclosure is not limited thereto.

Referring to FIG. 7, one third conductive layer 780 may be disposed on one first conductive layer 711, one second conductive layer 712, and the resin layer 780.

One first conductive layer 711 and one second conductive layer 712 may be electrically connected through one third conductive layer 780.

The lengths L1 and L2 of the first and second conductive layers 711 and 712 may be shorter than the length L3 of the resin layer 780.

The lengths L1 and L2 of the first and second conductive layers 711 and 712 and the length L3 of the resin layer 780 may be lengths in a direction perpendicular to the direction in which the light source 210 is stacked on each substrate 701 and 702.

Although not shown in FIG. 7, the first conductive layer 711 may be electrically connected to the plurality of transistors disposed on the first substrate 701. The second conductive layer 712 may be electrically connected to the plurality of transistors disposed on the second substrate 702.

As such, the first and second substrates 701 and 702 may be coupled through the resin layer 78 and be electrically connected to each other through the plurality of first conductive layers 711, the plurality of second conductive layers 712, and the plurality of third conductive layers 790.

Although not shown in FIG. 7, the first and second substrates 701 and 702 coupled to each other may be seated in one cover bottom.

When a plurality of substrates on which light sources are mounted are seated in the cover bottom, the circuit boards respectively connected to the substrates should be connected.

Each substrate may be electrically connected to an individual circuit board via the circuit board. The individual circuit boards may be electrically connected to one central circuit board.

However, it is difficult to place the circuit films and individual circuit boards respectively connected to the substrates, the central circuit board, and the circuit films connecting the central circuit board and the individual circuit boards in the cover bottom due to spatial issues.

Accordingly, to pull the circuit film and the circuit board connected to each substrate out of the cover bottom, a plurality of holes may be formed in the bottom surface of the cover bottom. For example, a plurality of holes may be arranged in the long side direction of the cover bottom.

However, when a plurality of holes are formed in the cover bottom, the rigidity of the cover bottom may be reduced.

Further, as the plurality of circuit films, the plurality of individual circuit boards, and the central circuit board are disposed outside the cover bottom, the thickness of the backlight unit may be increased.

The plurality of substrates 701 and 702 included in the backlight unit of the display device according to embodiments of the disclosure may be electrically connected to each other, eliminating the need for individual circuit boards electrically connected to the substrates, respectively, and the central circuit board connected to the individual circuit boards and allowing for control of the plurality of transistors disposed on the plurality of substrates 701 and 702 with only one circuit board.

Accordingly, it is sufficient that the cover bottom has one hole through which one circuit film electrically connected with the first and second substrates 701 and 702 passes. Accordingly, it is possible to obtain higher rigidity than the rigidity of the cover bottom having a plurality of holes in the bottom surface.

Further, since there is only one circuit board disposed outside the cover bottom, the thickness of the backlight unit may be reduced.

A process for forming a structure in which the first and second substrates 701 and 702 are connected is described below.

FIGS. 8, 9, 10, and 11 are schematically illustrating a process for forming first and second substrates as shown in FIG. 7 according to one embodiment.

Substantially the same configurations and effects as those described above are not repeatedly described below. In the following description, the same reference numbers may be used to denote the same elements or components as those described in the above embodiments.

Figure 8:
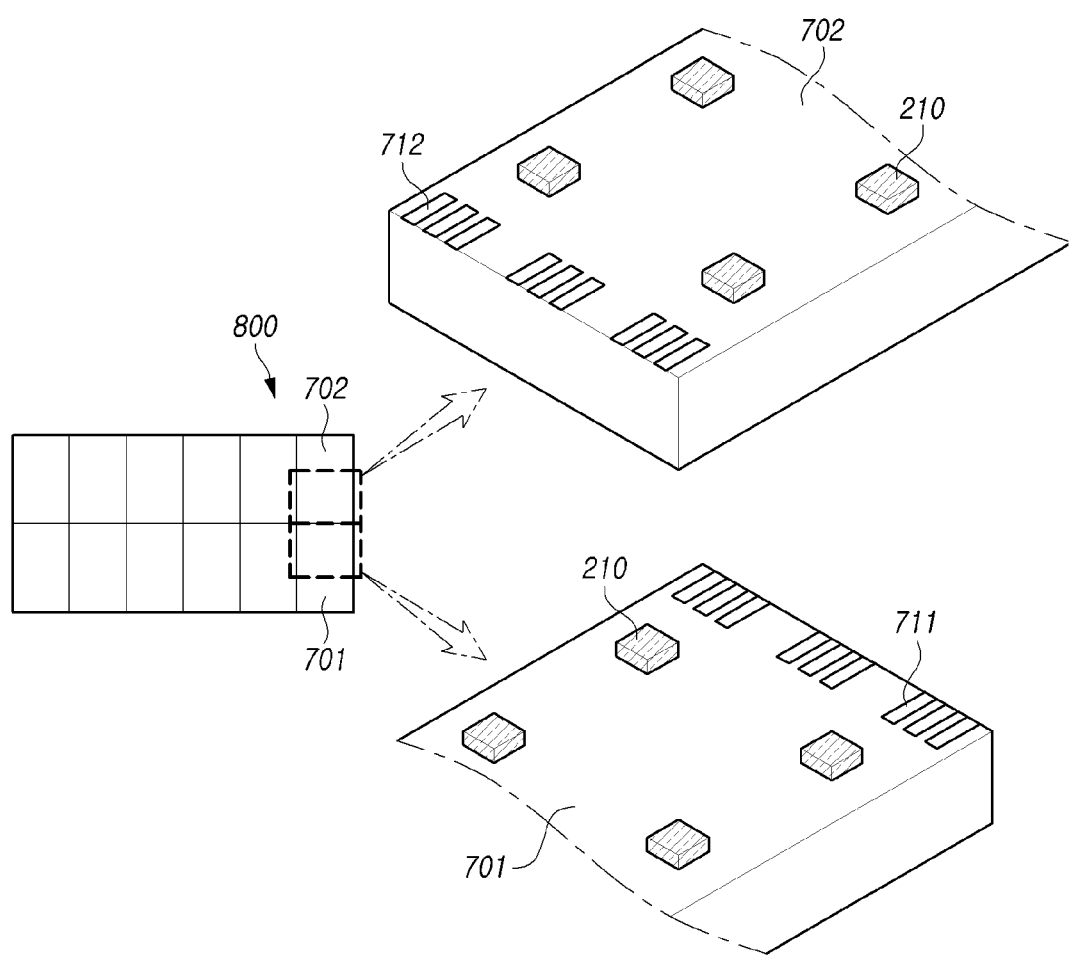
FIGS. 8, 9, 10, and 11 are schematically illustrating a process for forming first and second substrates as shown in FIG. 7 according to embodiments of the disclosure.
Figure 9:
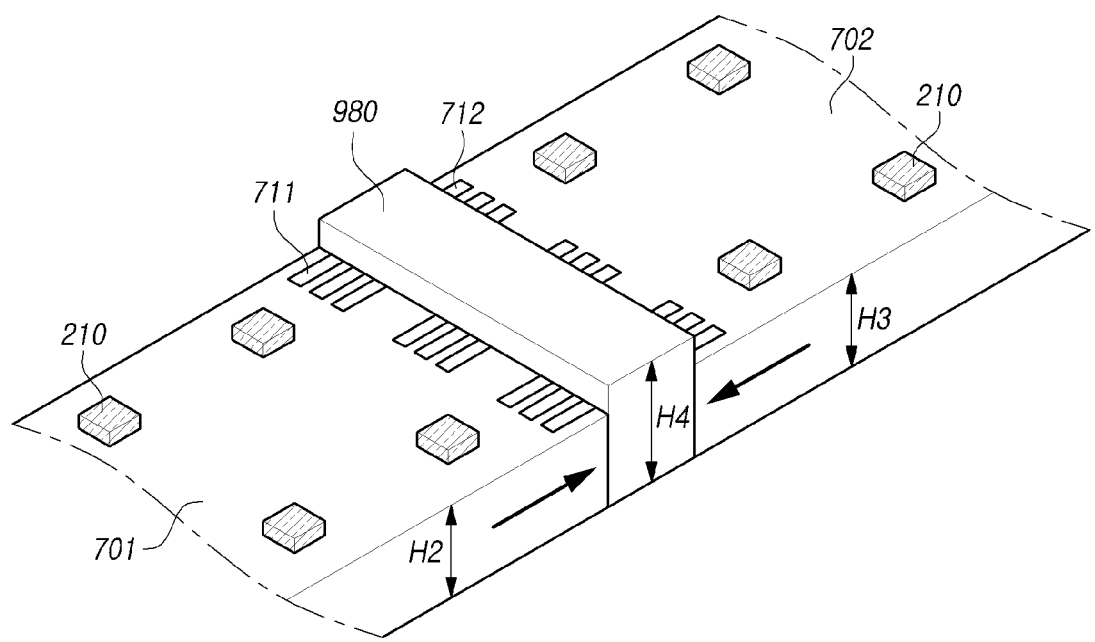
Figure 10:
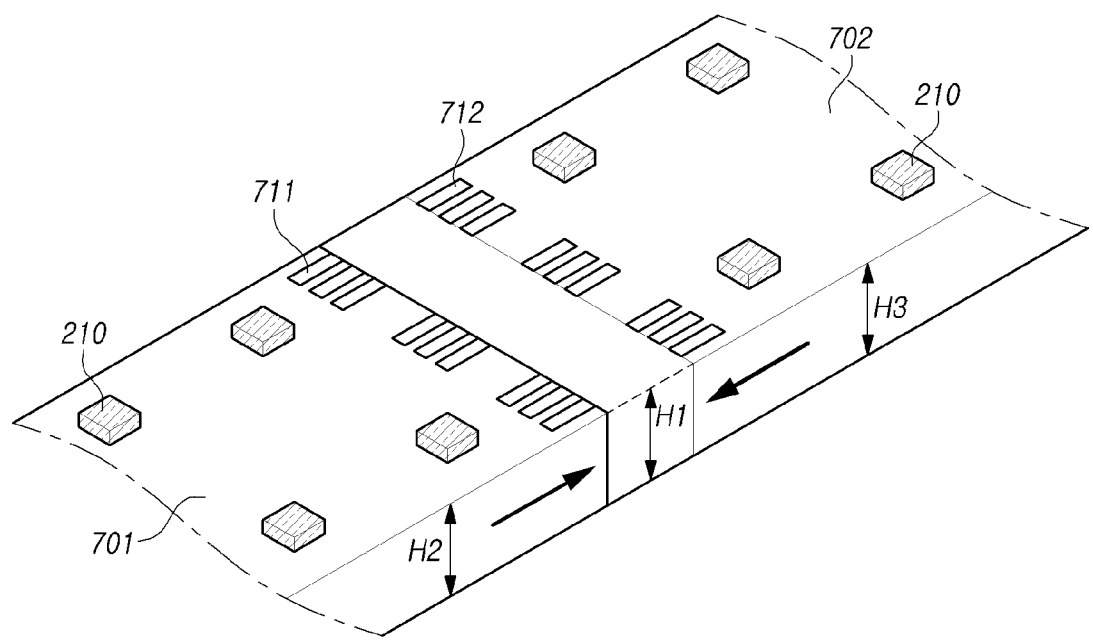

Referring to FIGS. 8 and 9, a mother substrate 800 on which a plurality of light sources are disposed may include a plurality of individual substrates.

The first substrate 701 and the second substrate 702 may be substrates included in the mother substrate 800.

The first substrate 701 and the second substrate 702 may be substrates disposed side by side in the length direction of the mother substrate 800 (e.g., the direction in which the shorter sides of the four sides of the mother substrate extend).

As described above, a plurality of first conductive layers 711 may be disposed on the first substrate 701, and a plurality of second conductive layers 712 may be disposed on the second substrate 702.

As illustrated in FIG. 9, after a resin material 980 fills the space between the first substrate 701 and the second substrate 702, the resin material 980 may be cured by ultraviolet (UV) light.

One side of the first substrate 701 and one side of the second substrate 702 may be connected by the cured resin material 980 with the resin material 980 interposed therebetween.

Although not shown in FIG. 7, the first and second substrates 701 and 702 coupled to each other may be seated in one cover bottom.

When the plurality of substrates are seated in the cover bottom, the height H4 of the resin material 980 cured to each substrate may be larger than the height H2 of the first substrate 701 and the height H3 of the second substrate 702.

Thereafter, the resin material may be polished to make the height H4 of the resin material 980 identical to the height H2 of the first substrate 701 and the height H3 of the second substrate 702.

Accordingly, the height H1 of the resin layer 780 disposed between the first and second substrates 701 and 702 may correspond to the respective heights H1 and H2 of the first and second substrates 701 and 702.

As the height H1 of the layer 780 is formed to correspond to the respective heights H1 and H2 of the first and second substrates 701 and 702, the plurality of third conductive layers 790 disposed on the resin layer 780 may be prevented from damage.

For example, when the height H1 of the resin layer 780 is different from the respective heights H1 and H2 of the first and second substrates 701 and 702, the plurality of third conductive layers 790 may easily be broken due to concentration of stress in the area where the plurality of third conductive layers 790 overlap the resin layer 780.

Figure 11:
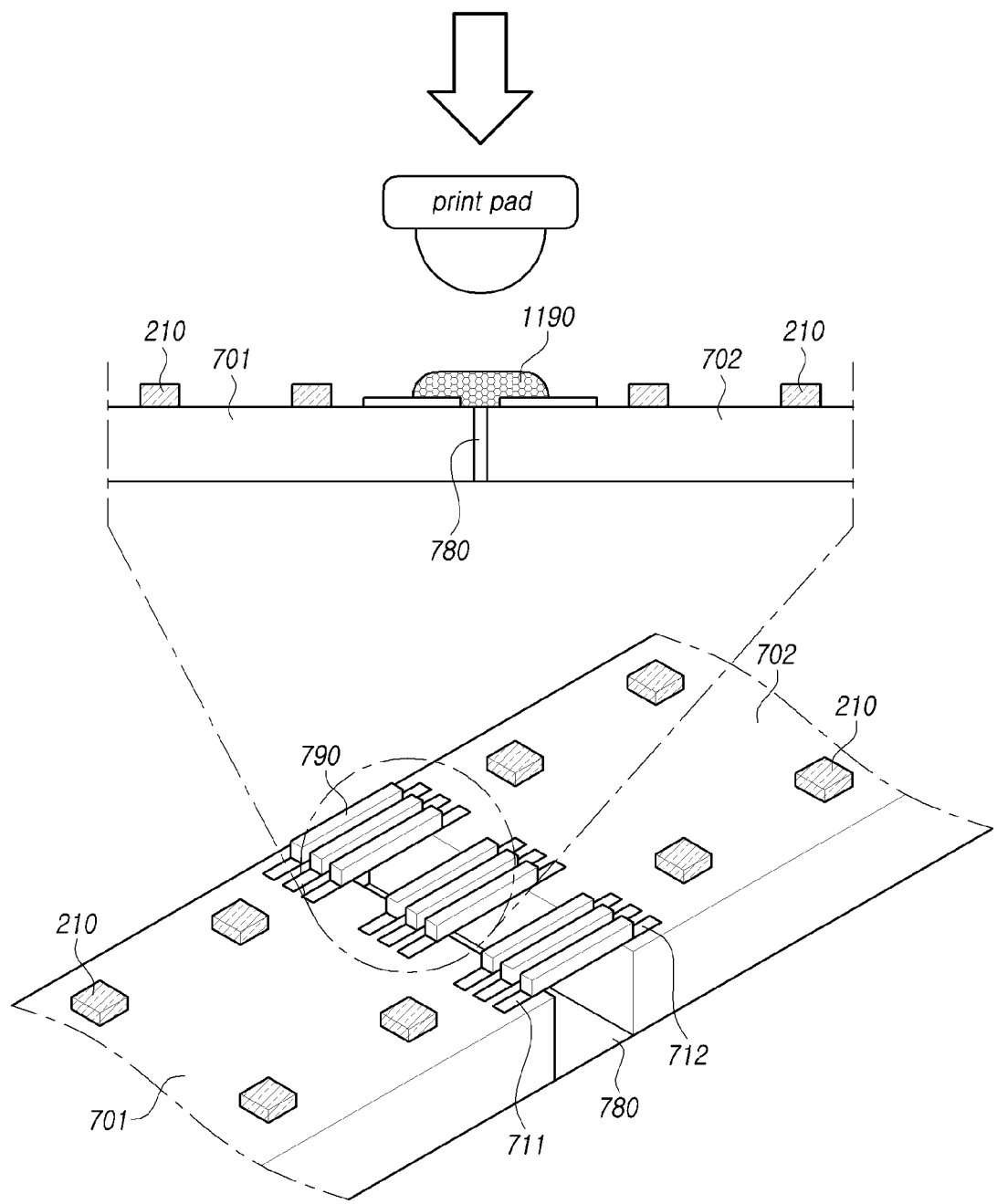

Thereafter, as illustrated in FIG. 11, a third conductive layer material 1190 may be applied to a portion of the upper surface of each of the first and second substrates 701 and 702 and at least a portion of the upper surface of the resin layer 780.

The third conductive layer material 1190 may include any one of metals, such as silver (Ag), aluminum (Al), gold (Au), copper (Cu), tungsten (W), molybdenum (Mo), chromium (Cr), tantalum (Ta), and titanium (Ti), or alloys thereof, but the disclosure is not limited thereto.

The applied third conductive layer material 1190 may be patterned to become the plurality of third conductive layers 790.

Another structure of the backlight unit of the display device according to embodiments of the disclosure is described below.

FIGS. 12 to 15 are views schematically illustrating a portion of a backlight unit of a display device according to embodiments of the disclosure.

Substantially the same configurations and effects as those described above are not repeatedly described below. In the following description, the same reference numbers may be used to denote the same elements or components as those described in the above embodiments.

Figure 12:
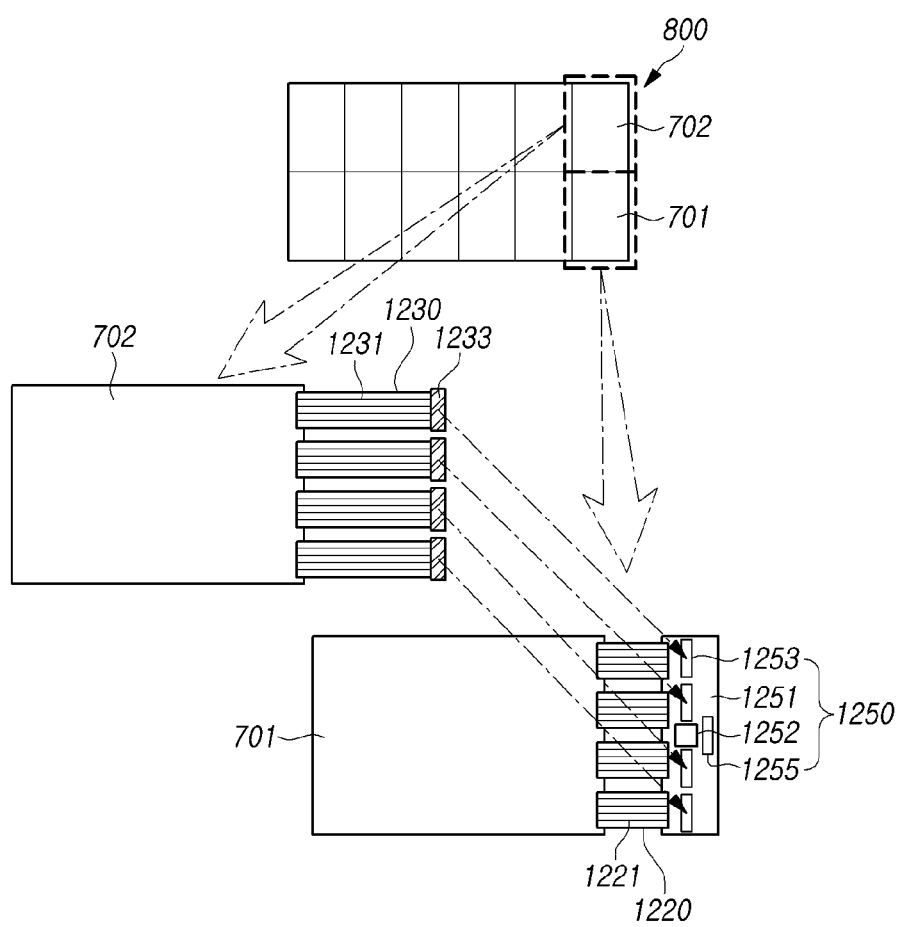
FIGS. 12, 13, 14, and 15 are views schematically illustrating a portion of a backlight unit of a display device according to embodiments of the disclosure.

Referring to FIG. 12, the first substrate 701 and the second substrate 702 included in the mother substrate 800 may be electrically connected to one circuit board 1250.

Specifically, a plurality of first circuit films 1220 may be connected to one side of the first substrate 701.

A plurality of lines 1221 may be disposed on each of the plurality of first circuit films 1220.

The plurality of first circuit films 1220 may be bonded to a portion of the upper surface of the first substrate 701. Accordingly, one end of the plurality of lines 1221 may be electrically connected to the plurality of first conductive layers (or pad electrodes) disposed on the first substrate 701.

Another end of the plurality of first circuit films 1220 may be bonded to the circuit board 1250.

The circuit board 1250 may include at least one chip 1252, a plurality of first connection portions 1253, and at least one second connection portion 1255 disposed on the board 1251.

The second connection portion 1255 may be connected to a control circuit board including a timing controller, but embodiments of the disclosure are not limited thereto.

At least one chip 1252 disposed on the board 1251 may be a source driver integrated circuit.

The plurality of first connection portions 1253 disposed on the board 1251 may be disposed to be spaced apart from each other.

At least one second connection portion 1255 spaced apart from the plurality of first connection portions 1253 may be disposed on the board 1251.

Referring to FIG. 12, a plurality of second circuit films 1230 may be connected to one side of the second substrate 702.

Figure 13:
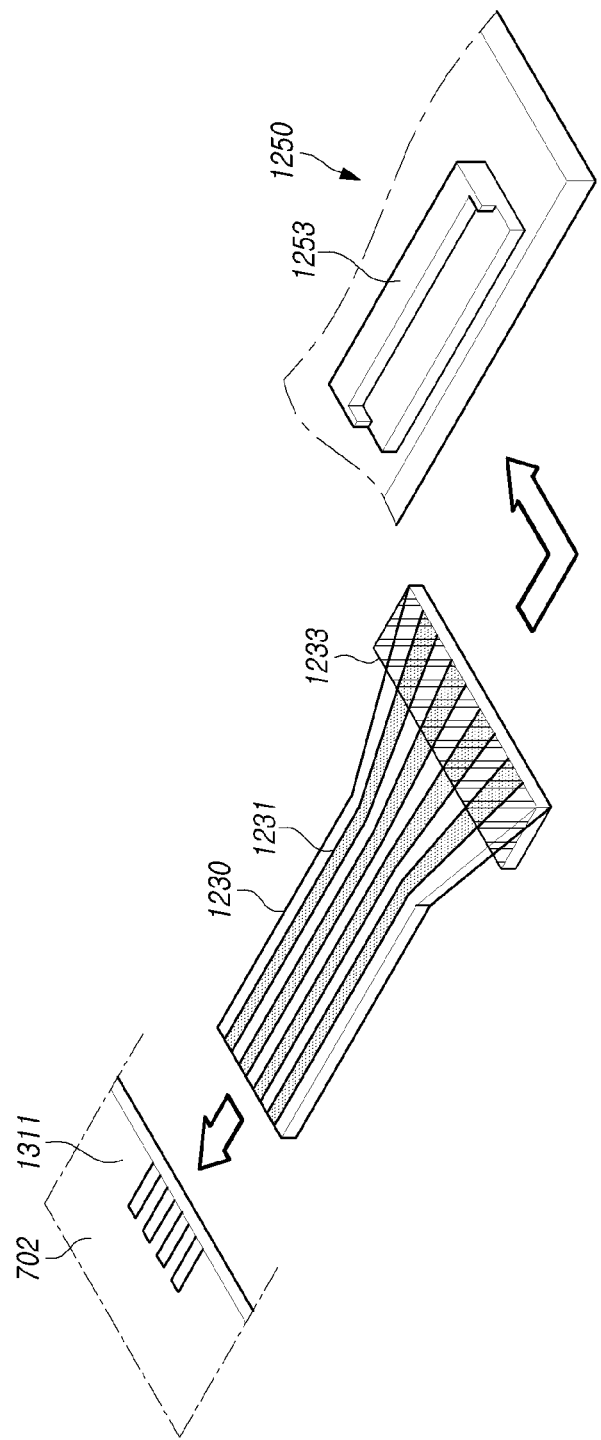

As shown in FIGS. 12 and 13, a plurality of lines 1232 may be disposed on the plurality of second circuit films 1230.

The second circuit film 1230 may be bonded to a portion of the upper surface of the second substrate 702. Accordingly, one end of the plurality of lines 1232 may be electrically connected to the plurality of second conductive layers 1311 (or pad electrodes) disposed on the second substrate 702.

Another end of the plurality of second circuit films 1230 may be connected to a third connection portion 1233.

Referring to FIGS. 12 and 13, one third connection portion 1233 may be coupled to one first connection portion 1253.

Accordingly, the second substrate 702 may be electrically connected to the circuit board 1250 electrically connected to one side of the first substrate 701.

As such, the first substrate 701 and the second substrate 702 may be electrically connected to the same circuit board 1250 through the first connection portion 1253 and the third connection portion 1233.

Figure 14:
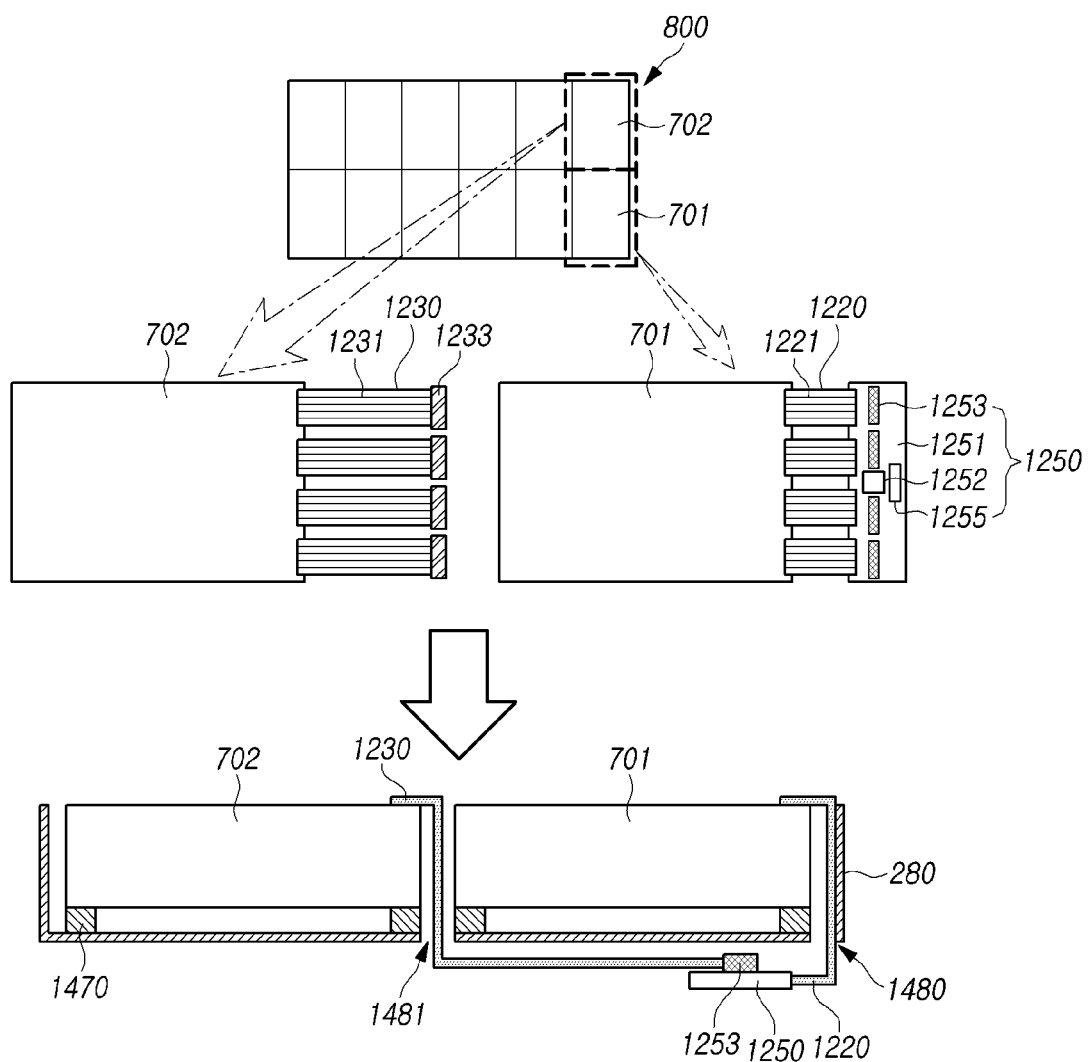
Figure 15:
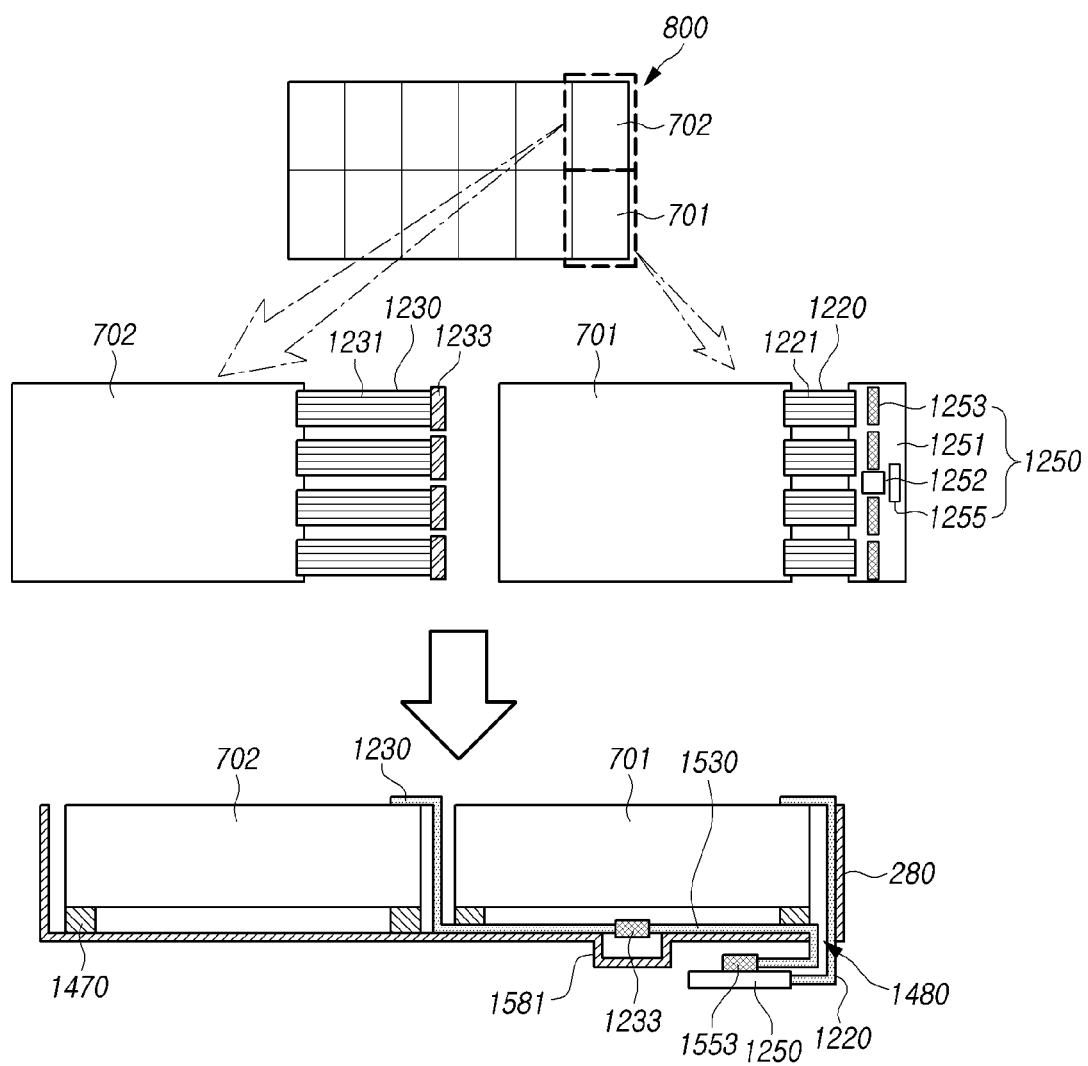

As shown in FIG. 14 or 15, the first substrate 701 and the second substrate 702 may be seated in the cover bottom 280.

Referring to FIG. 14, the first and second substrates 701 and 702 may be fixed to the bottom surface of the cover bottom 280 through a foam pad 1470.

The foam pad 1470 may serve to fix the first and second substrates 701 and 702 to the cover bottom 280 and absorb shocks.

When the first and second substrates 701 and 702 are improperly attached to the bottom surface of the cover bottom 280 through the foam pad 1470, the foam pad 1470 may be peeled off from the cover bottom 280 and be reattached to the bottom surface of the cover bottom 280.

Referring to FIG. 14, the cover bottom 280 may include two holes 1480 and 1481.

The holes 1480 and 1481 of the cover bottom 280 may be provided in the bottom surface of the cover bottom 280, but the structure of the cover bottom 280 according to embodiments of the disclosure is not limited thereto. In some cases, the holes may also be present in the side surface of the cover bottom 280.

The first circuit film 1220 connected to one side of the first substrate 701 through the hole 1480 of the cover bottom 280 may exit the cover bottom 280.

The second circuit film 1230 connected to one side of the second substrate 702 may exit the cover bottom 280 through the other hole 1481 than the hole 1480 through which the first circuit film 1220 passes. The hole 1481 through which the second circuit film 1230 passes may be disposed between the first substrate 701 and the second substrate 702, but the structure of the cover bottom 280 according to embodiments of the disclosure is not limited thereto.

Each of the first circuit film 1220 and the second circuit film 1230 may be bent in at least one area.

One side of the first circuit film 1220 may be bonded onto the first conductive layer of the first substrate 701, and another side of the first circuit film 1220 may be bonded to a portion of the upper surface of the circuit board 1250.

The circuit board 1250 may be disposed outside the cover bottom 280.

One side of the second circuit film 1230 may be bonded onto the second conductive layer of the second substrate 702, and another side of the second circuit film 1230 may be coupled and electrically connected to the first connection portion 1253 provided on the circuit board 1250.

As such, the backlight unit may be reduced in thickness by having a structure in which the plurality of substrates 701 and 702 are controlled through one circuit board 1250.

Referring to FIG. 15, the cover bottom 280 may include one hole 1480.

The first circuit film 1220 connected to one side of the first substrate 701 through the hole 1480 of the cover bottom 280 may exit to the outside of the cover bottom 280, and the second circuit film 1230 connected to one side of the second substrate 702 may also exit to the outside of the cover bottom 280 through the same hole 1480.

Each of the first circuit film 1220 and the second circuit film 1230 may be bent in at least one area.

One side of the first circuit film 1220 may be bonded onto the first conductive layer of the first substrate 701, and another side of the first circuit film 1220 may be bonded to a portion of the upper surface of the circuit board 1250.

As illustrated in FIG. 15, when the length of the second circuit film 1230 of the second substrate 702 is reduced, it may be electrically connected to the additional circuit film 1530 through the third connection portion 1253 of the second circuit film 1230.

Referring to FIG. 15, one side of the additional circuit film 1530 may be connected to the third connection portion 1253 of the second circuit film 1230, and another side of the additional circuit film 1430 may be connected to the fourth connection portion 1553.

The fourth connection portion 1553 may be coupled to the first connection portion 1253 of the circuit board 1250 and be thereby electrically connected to the circuit board 1250.

In other words, the second substrate 702 may be connected to the circuit board 1250 through the second circuit film 1230 and the additional circuit film 1430.

The cover bottom 280 may include a protrusion 1581 protruding from the portion where the third connection portion 1253 of the second circuit film 1230 is positioned to the outside of the circuit board 280.

The protrusion 1581 of the circuit board 280 may be a space provided so that the third connection portion 1253 may be positioned, since the thickness of the second circuit film 1230 with the third connection portion 1253 is larger than the thickness of the second circuit film 1230 without the third connection portion 1253.

As described above, since the first and second circuit films 1220 and 1230 may be structured to exit to the outside through one hole 1480 provided in the cover bottom 280, it is possible to form less holes 1480 in the cover bottom 280. Accordingly, it is possible to prevent the cover bottom 280 from being weakened in rigidity due to the hole 1480.

Further, since the first substrate 701 and the second substrate 702 are structured to be electrically connected to one circuit board 1250 and driven, it is possible to reduce the thickness of the backlight unit.

An arrangement of a plurality of glass substrates in a cover bottom and components disposed under the plurality of glass substrates when a backlight unit of a display device includes the plurality of glass substrates according to embodiments of the disclosure is described below in detail.

Figure 16:
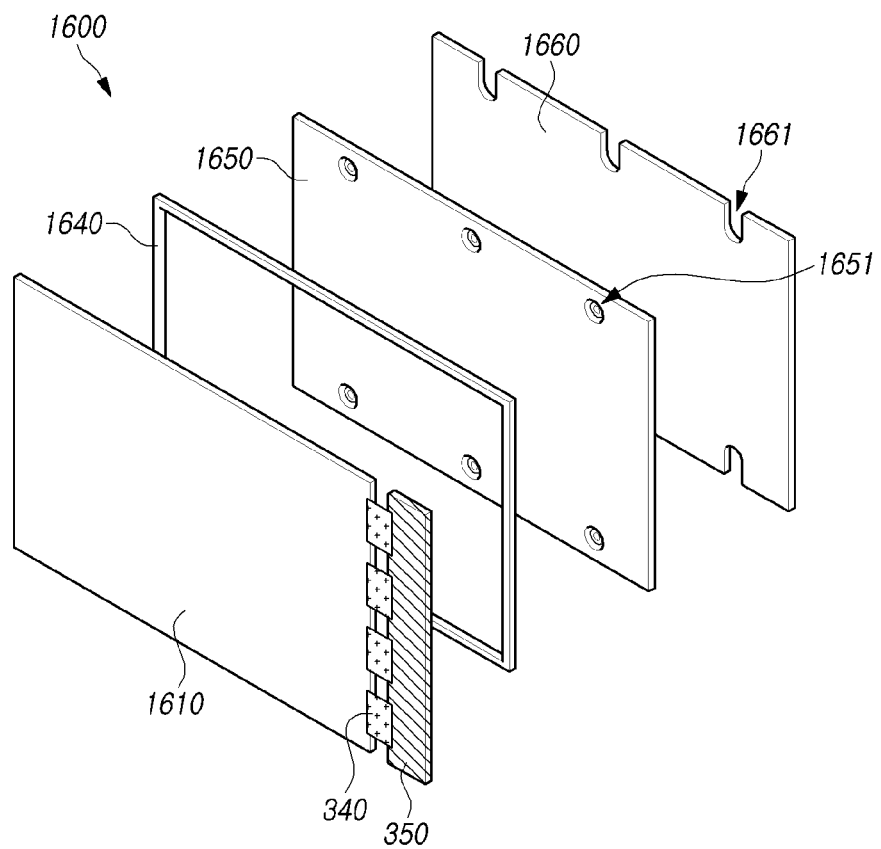
FIG. 16 is an exploded perspective view schematically illustrating one glass substrate among a plurality of glass substrates and components disposed under the glass substrate when a backlight unit of a display device includes the plurality of glass substrates according to embodiments of the disclosure.
Figure 17:
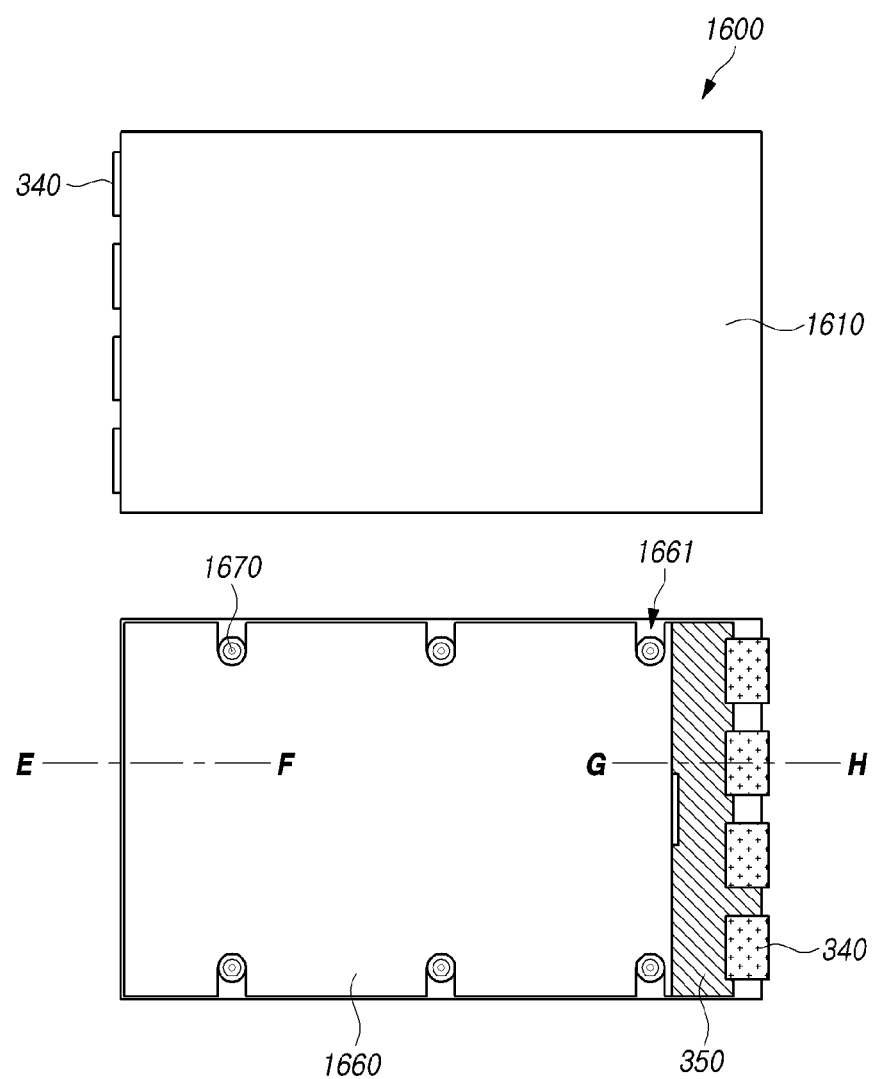
FIG. 17 is a view illustrating a state in which the components shown in FIG. 16 are coupled according to embodiments of the disclosure.

FIG. 16 is an exploded perspective view schematically illustrating one glass substrate among a plurality of glass substrates and components disposed under the glass substrate when a backlight unit of a display device includes the plurality of glass substrates according to embodiments of the disclosure. FIG. 17 is a view illustrating a state in which the components shown in FIG. 17 are coupled.

Substantially the same configurations and effects as those described above are not repeatedly described below. In the following description, the same reference numbers may be used to denote the same elements or components as those described in the above embodiments.

Referring to FIG. 16, the backlight unit of the display device according to embodiments of the disclosure may include a sub-substrate 1610, a first foam pad 1640, a plate 1650, and a heat dissipation sheet 1660.

The sub-substrate 1610 may be a glass substrate, and a plurality of circuit films 340 and a circuit board 350 may be connected to one side of the sub-substrate 1610. The structure of the sub-substrate 1610 may correspond to the structure of the substrate 200 shown in FIG. 3.

One first foam pad 1640 may be disposed on the rear surface of the sub-substrate 1610.

The first foam pad 1640 may have a rectangular shape and may have a shape surrounding the periphery of the sub-substrate 1610, but the shape of the first foam pad 1640 according to embodiments of the disclosure is not limited thereto.

A plate 1650 may be disposed on the rear surface of the first foam pad 1640.

One sub-substrate 1610 may be attached to the upper surface of the plate 1650 through the first foam pad 1640.

The first foam pad 1640 may have a structure in which an adhesive is attached to each of two opposite surfaces of an elastic material, but the structure of the first foam pad 1640 according to embodiments of the disclosure is not limited thereto.

A plurality of holes 1651 may be provided in the plate 1650.

In this case, the plate 1650 may include aluminum (Al) or an aluminum alloy, but the material of the plate 1650 according to embodiments of the disclosure is not limited thereto, and may be formed of any material that may serve as a reflector and is suitable for forming the plurality of holes 1651.

The plurality of holes 1651 may be disposed to be spaced apart from each other.

The heat dissipation sheet 1660 may be disposed on the rear surface of the plate 1650.

The heat dissipation sheet 1660 may be a polymer sheet (e.g., PET sheet) having a heat dissipation function and capable of shape processing, but embodiments of the disclosure are not limited thereto.

Although FIG. 16 illustrates a structure in which the heat dissipation sheet 1660 is disposed on the rear surface of the plate 1650, embodiments of the disclosure is not limited thereto, and the heat radiation sheet 1660 may not be provided on the rear surface of the plate 1650.

In the following description, for convenience of description, a structure in which the heat dissipation sheet 1660 is disposed on the rear surface of the plate 1650 is described.

One substrate 1610, one first foam pad 1640, one plate 1650, and one heat dissipation sheet 1651 illustrated in FIG. 16 may constitute one substrate set 1600.

Although not shown in FIG. 16, a plurality of substrate sets 1600 may be seated on the cover bottom. Accordingly, it is possible to provide a backlight unit capable of uniformly supplying light even to a large-area display panel.

When the substrate 200 is formed of glass, it may be difficult to fix a plurality of substrates to the underlying component.

When the substrate is formed of a general metal material, a hole may be formed in the substrate to be coupled with an adjacent substrate via a fastening member (e.g., screw), forming a substrate where large-area light sources are mounted.

However, it may be impossible to form a hole in a glass substrate 200.

Accordingly, the sub-substrate 1610 according to embodiments of the disclosure may be coupled through the first foam pad 1640, the plate 1650, and the heat dissipation sheet 1660.

Specifically, as shown in FIG. 16, the substrate 200 may be adhered to the plate 1650 by the first foam pad 1640.

A plurality of holes 1651 may be formed in the plate 1650, and a plurality of openings 1661 may be formed in the heat dissipation sheet 1660.

Referring to FIGS. 16 and 17, one hole 1651 of the plate 1650 may be disposed to overlap one opening 1661 of the heat dissipation sheet 1660.

One fastening member (e.g., screw) may be fastened to each opening 1661 and overlapping hole 1651.

When the fastening member is a foam pad, the heat dissipation sheet 1660 may omit the opening 1661, but embodiments of the disclosure are not limited thereto.

When the substrate set 1600 is coupled through the first foam pad 1640 and the fastening member, as illustrated in FIG. 17, a sub-substrate 1610 formed of glass may be positioned on the front surface of one substrate set 1600.

The heat dissipation sheet 1660 and a plurality of fastening members may be disposed on the rear surface of one substrate set 1600. A plurality of circuit films 340 connected to one side of the sub-substrate 1610 may be bent so that the circuit board 350 may be positioned on the rear surface of the substrate set 1600.

A detailed structure of the substrate set 1600 will be further described below with reference to FIGS. 18 and 19.

Figure 18:
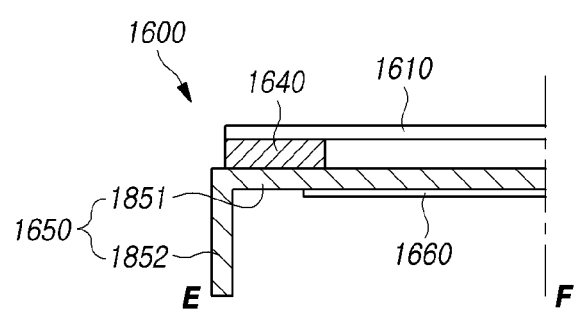
FIG. 18 is a cross-sectional view taken along line E-F of FIG. 17 according to embodiments of the disclosure.

FIG. 18 is a cross-sectional view taken along line E-F of FIG. 17 according to one embodiment. FIG. 19 is a cross-sectional view taken along line G-H of FIG. 17 according to one embodiment.

Substantially the same configurations and effects as those described above are not repeatedly described below. In the following description, the same reference numbers may be used to denote the same elements or components as those described in the above embodiments.

Referring to FIG. 18, the substrate set 1600 according to embodiments of the disclosure may include a sub-substrate 1610, a first foam pad 1460, a plate 1650, and a heat dissipation sheet 1660.

The first foam pad 1460 may be disposed on the rear surface of the sub-substrate 1610 and at the periphery of the sub-substrate 1610.

The plate 1650 disposed on the rear surface of the first foam pad 1460 and the sub-substrate 1610 include a flat portion 1851 and a vertical portion 1852.

The flat portion 1851 may be disposed on the rear surface of the sub-substrate 1610 and include a surface to which the first foam pad 1640 is attached. The flat portion 1851 may be disposed to face the sub-substrate 1610.

The flat portion 1851 and the sub-substrate 1610 may be disposed to be spaced apart from each other by the thickness of the first foam pad 1460 in an area where the first foam pad 1640 is not disposed.

The vertical portion 1852 may be a portion extending from a side surface of the flat portion 1851 in a direction crossing the extending direction of the flat portion 1851.

The backlight unit according to embodiments of the disclosure may include a plurality of sub-substrates 1610, a plurality of first foam pads 1460, and a plurality of plates 1650. As illustrated in FIG. 18, to prevent the sub-substrate 1610 from being damaged by interfering with another sub-substrate 1610 disposed adjacent thereto, an end of the sub-substrate 1610 may be disposed to overlap the upper surface of the flat portion 1851 of the plate 1650.

The heat dissipation sheet 1660 may be disposed on the rear surface of the flat portion 1851 of the plate 1650.

Figure 19:
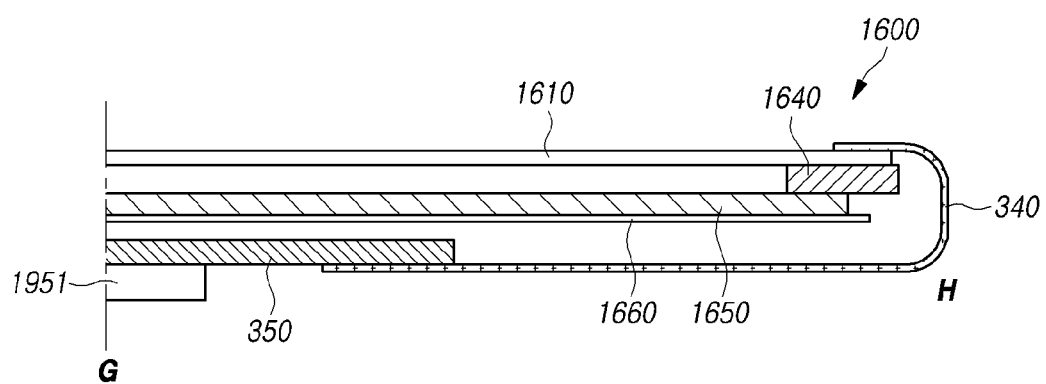
FIG. 19 is a cross-sectional view taken along line G-H of FIG. 17 according to embodiments of the disclosure.

As illustrated in FIG. 19, the circuit film 340 connected to a portion of the upper surface of one side of the sub-substrate 1610 is bent to overlap one side surface of each of the sub-substrate 1610, the first foam pad 1640, the plate 1650, and the heat dissipation sheet 1660 so that one end of the circuit film 340 may be disposed to overlap the rear surface of the heat dissipation sheet 1660.

A circuit board 350 may be electrically connected to one end of the circuit film 340, and a connector 1951 connected to the timing controller may be provided on the circuit board 350.

FIGS. 16 to 18 illustrate a structure of one substrate set 1600, but a plurality of substrate sets 1600 may be disposed in the cover bottom in the backlight unit of the display device according to embodiments of the disclosure.

This is discussed below with reference to FIGS. 20 to 24.

Figure 20:
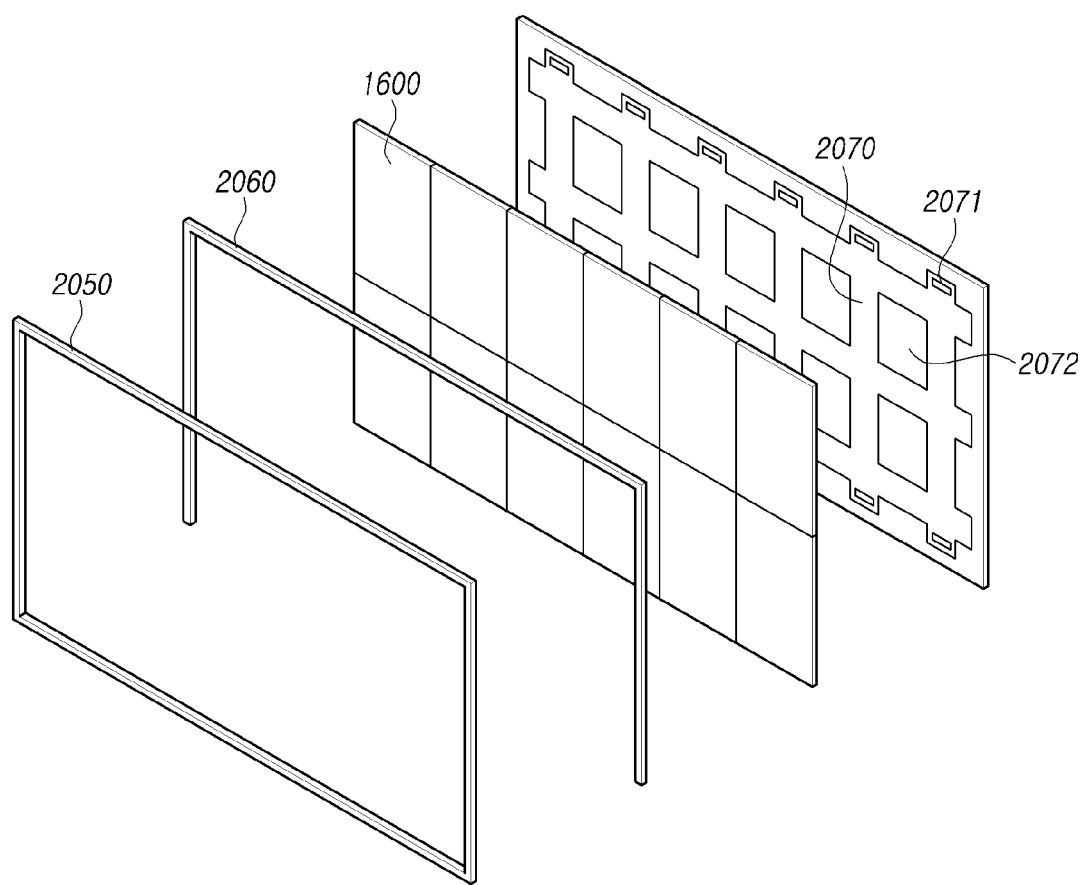
FIG. 20 is an exploded perspective view schematically illustrating a plurality of glass substrates in a cover bottom and components disposed under the plurality of glass substrates when a backlight unit of a display device includes the plurality of glass substrates according to embodiments of the disclosure.
Figure 21:
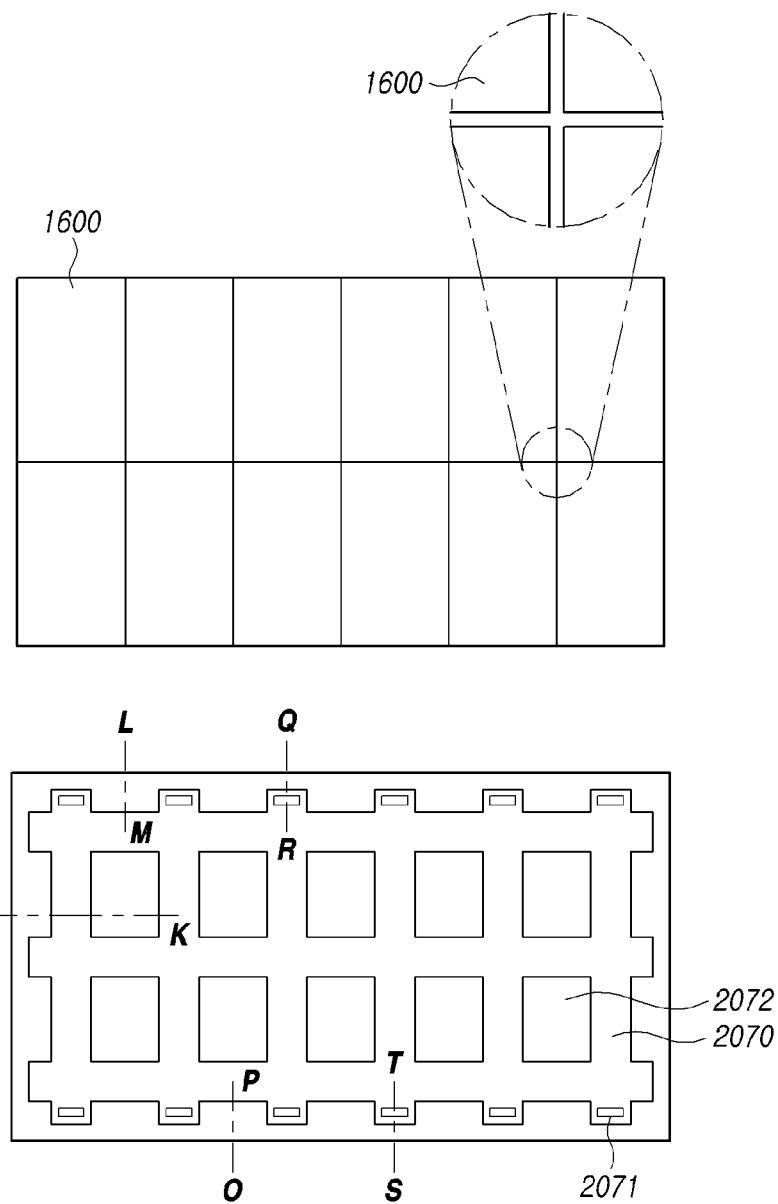
FIG. 21 is a view illustrating a structure in which a plurality of substrate sets and a cover bottom are coupled according to embodiments of the disclosure.

FIG. 20 is an exploded perspective view schematically illustrating a plurality of glass substrates in a cover bottom and components disposed under the plurality of glass substrates when a backlight unit of a display device includes the plurality of glass substrates according to embodiments of the disclosure. FIG. 21 is a view illustrating a structure in which a plurality of substrate sets and a cover bottom are coupled according to one embodiment.

Substantially the same configurations and effects as those described above are not repeatedly described below. In the following description, the same reference numbers may be used to denote the same elements or components as those described in the above embodiments.

Referring to FIG. 20, a backlight unit of a display device according to embodiments of the disclosure may include a sub guide panel 2050, a second foam pad 2060, a plurality of substrate sets 1600, and a cover bottom 2070.

One second foam pad 2060 may be disposed on the rear surface of the sub guide panel 2050.

The sub guide panel 2060 may be formed of a white plastic material. For example, the sub guide panel 2060 may be formed of polycarbonate, but embodiments of the disclosure are not limited thereto.

The sub guide panel 2060 may have a property of reflecting light. Accordingly, a portion of the light emitted from the plurality of light sources disposed on the plurality of sub-substrates may be reflected by the sub guide panel 2060 towards the display panel without being absorbed by the guide panel positioned on the side of the backlight unit.

Accordingly, the light efficiency of the backlight unit may be enhanced.

A plurality of substrate sets 1600 may be disposed on the rear surface of the second foam pad 2060.

Each substrate set 1600 may include a substrate 1610, a first foam pad 1640, a plate 1650, and a heat dissipation sheet 1660, as shown in FIG. 16.

As shown in FIGS. 20 and 21, the number of the plurality of substrate sets 1600 may be changed depending on the size of the display panel. The backlight unit according to embodiments of the disclosure may include an even number of substrate sets 1600. The plurality of substrate sets 1600 may have a shape, such as a rectangle or a square, in a plan view.

Referring to FIG. 21, the substrate sets 1600 may be disposed to be spaced apart from each other to prevent interference between each other.

A cover bottom 2070 may be disposed on the rear surface of the plurality of substrate sets 1600.

As illustrated in FIG. 20, the sub guide panel 2050 may have a shape surrounding the periphery of the upper surfaces of the plurality of substrate sets 1600.

As illustrated in FIG. 20, the second foam pad 2060 may have a rectangular shape with at least one side open. However, the shape of the second foam pad 2060 according to embodiments of the disclosure is not limited thereto, but may be a rectangular shape without such side opening.

In the following description, for convenience of description, the second foam pad 2060 has a rectangular shape with one side open, and the open area of the second foam pad 2060 may be an area in which the plurality of circuit films connected to the sub-substrates of the plurality of substrate sets 1600 are disposed.

The plurality of circuit films connected to the sub-substrates of the plurality of substrate sets 1600 may be disposed on two sides of the backlight unit, but embodiments of the disclosure are not limited thereto.

As shown in FIGS. 20 and 21, the cover bottom 2070 may have a plurality of holes 2071 and at least one pattern 2072.

The cover bottom 2070 may have the plurality of holes 2071 to fix the plurality of substrate sets 1600 to the cover bottom 2070.

A plurality of lines connected to the connector disposed on the circuit boards included in the plurality of substrate sets 1600 may pass through some of the plurality of holes 2071 of the cover bottom 270. Although not shown in the drawings, the plurality of lines connected to the connector may be connected to the timing controller disposed on the rear surface of the cover bottom 2070.

FIGS. 20 and 21 illustrate a structure in which the plurality of holes 2071 of the cover bottom 2070 are disposed side by side in the length direction at two opposite ends of the cover bottom 2070, but the plurality of holes 2071 of the cover bottom 2070 according to embodiments of the disclosure may be provided in various positions. For example, a plurality of holes may also be provided in the central portion of the cover bottom 2070.

Further, as the cover bottom 2070 has at least one pattern 2072, the surface of the cover bottom 2070 may not be flat. The pattern 2072 of the cover bottom 2070 may serve to enhance the rigidity of the cover bottom 2070.

This structure is discussed below in detail with reference to FIGS. 22 to 24.

Figure 22A:
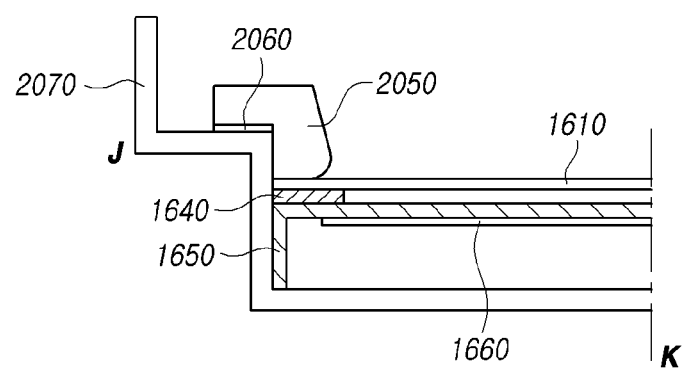
FIGS. 22A to 22C are cross-sectional views taken along lines J-K, L-M, and O-P of FIG. 21 according to embodiments of the disclosure.
Figure 22B:
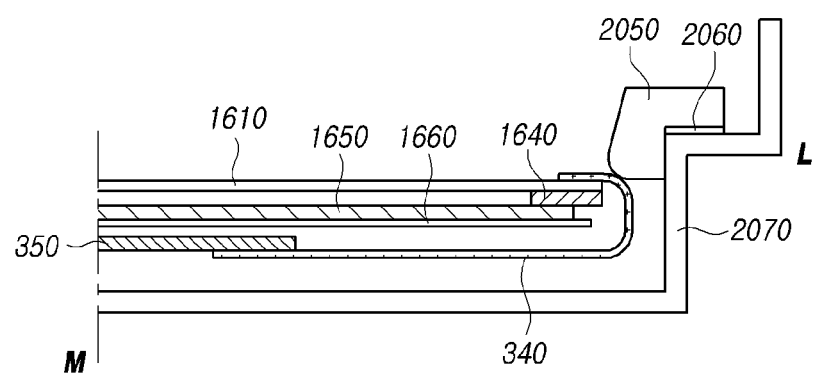
Figure 22C:
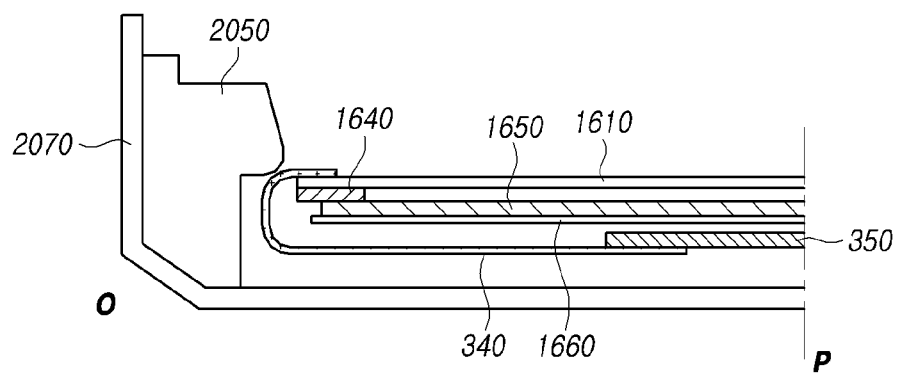

FIG. 22 is a cross-sectional view taken along lines J-K, L-M, and O-P of FIG. 21 according to one embodiment. FIG. 23 is a cross-sectional view taken along line Q-R of FIG. 21 according to one embodiment. FIG. 24 is a cross-sectional view taken along line S-T of FIG. 21 according to one embodiment.

Substantially the same configurations and effects as those described above are not repeatedly described below. In the following description, the same reference numbers may be used to denote the same elements or components as those described in the above embodiments.

Referring to FIG. 22, a backlight unit of a display device according to embodiments of the disclosure may include a sub guide panel 2050, a second foam pad 2060, a plurality of substrate sets 1600, and a cover bottom 2070.

One surface of the second foam pad 2060 may be attached to a portion of the upper surface of the cover bottom 2070, and the second foam pad 2060 may be attached to one surface of the sub guide panel 2050.

As illustrated in FIG. 22, a portion of the sub guide panel 2050 attached to one surface of the second foam pad 2060 in an area corresponding to one side of the plurality of substrate sets 1600 may overlap a portion of the upper surface of the plurality of substrate sets 1600.

As illustrated in FIG. 22, a portion of the sub guide panel 2050 attached to one surface of the second foam pad 2060 in an area corresponding to another side of the plurality of substrate sets 1600 may overlap a portion of the upper surface of the plurality of circuit boards 340 connected to the sub-substrate 1610 of the plurality of substrate sets 1600.

As illustrated in FIG. 22, in an area corresponding to another side of the plurality of substrate sets 1600, a portion of the sub guide panel 2050 may overlap a portion of the upper surface of the plurality of circuit boards 340 connected to the sub-substrates 1610 of the plurality of substrate sets 1600.

In other words, in the area where the second foam pad 2060 is not disposed, a portion of the sub guide panel 2050 may overlap a portion of the upper surface of the plurality of circuit boards 340 connected to the sub-substrates 1610 of the plurality of substrate sets 1600.

Figure 23:
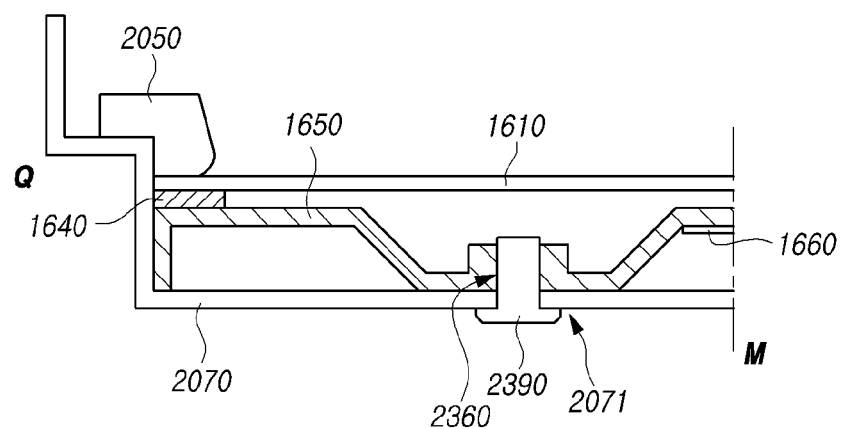
FIG. 23 is a cross-sectional view taken along line Q-R of FIG. 21 according to embodiments of the disclosure.
Figure 24:
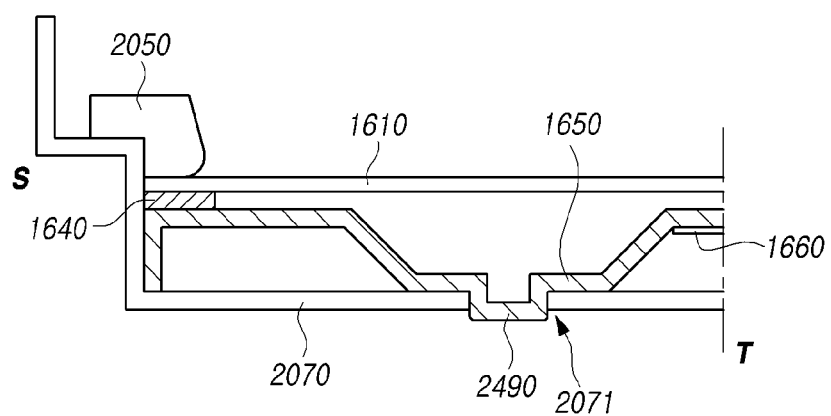
FIG. 24 is a cross-sectional view taken along line S-T of FIG. 21 according to embodiments of the disclosure.

Referring to FIGS. 23 and 24, in the backlight unit of the display device according to embodiments of the disclosure, the plate 1640 of the plurality of substrate sets 1640 and the cover bottom 2070 may be coupled via the fastening member 2390 or the protrusion 2490 of the plate 1640.

Specifically, referring to FIG. 23, the plate 1640 of the plurality of substrate sets 1600 may include a hole 2360. The cover bottom 2070 may include a hole 2071 in an area corresponding to the hole 2360 of the plate 1640.

The fastening member 2390 may be fastened to the hole 2360 of the plate 1640 and the hole 2071 of the cover bottom 2070.

Referring to FIG. 24, the plate 1640 may include at least one protrusion 2490. The protrusion 2490 of the plate 1640 may be inserted and fixed into the hole 2071 of the cover bottom 2070.

As the protrusion 2490 of the plate 1640 is inserted and fixed into the hole 2071 of the cover bottom 2070, the cover bottom 2070 and the plate 1640 may be prevented from shaking while the fastening member 2390 is fastened to the hole 2360 of the plate 1640 and the hole 2071 of the cover bottom 2070, so that the process of fastening with the fastening member 2390 may be facilitated.

As such, when a glass substrate where it is hard to form holes is used as a substrate on which light sources are to be mounted, a large-scale backlight unit may be provided through the individual substrate set 1600 and the cover bottom 2070.

The above description has been presented to enable any person skilled in the art to make and use the technical idea of the disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the disclosure. The above description and the accompanying drawings provide an example of the technical idea of the disclosure for illustrative purposes only. That is, the disclosed embodiments are intended to illustrate the scope of the technical idea of the disclosure. Thus, the scope of the disclosure is not limited to the embodiments shown, but is to be accorded the widest scope consistent with the claims. The scope of protection of the disclosure should be construed based on the following claims, and all technical ideas within the scope of equivalents thereof should be construed as being included within the scope of the disclosure.

What is claimed is:

1. A backlight unit, comprising:
   sub glass substrates;
   a plurality of light sources on each of the sub glass substrates;
   a first transistor and a second transistor on each of the sub glass substrates, the first transistor and the second transistor electrically connected with the plurality of light sources, and spaced apart from each other;
   a first foam pad on a rear surface of each of the sub glass substrates; and
   a substrate set including a plate on a rear surface of the first foam pad and the sub glass substrates, the plate having a plurality of holes.

2. The backlight unit of claim 1, wherein a plurality of circuit films are electrically connected to at least one side surface of each of the sub glass substrates, and
   wherein one end of a circuit film from the plurality of circuit films is bonded to a circuit board.

3. The backlight unit of claim 1, wherein the sub glass substrates and the plate are fastened through a first fastening member.

4. The backlight unit of claim 1, wherein the plate includes a flat portion that faces the sub glass substrates and a vertical portion on at least one side of the flat portion, and an end of one of the sub glass substrates overlaps the flat portion of the plate.

5. The backlight unit of claim 1, further comprising:
   a cover bottom on a rear surface and side surface of the substrate set,
   wherein a plurality of substrate sets are in the cover bottom.

6. The backlight unit of claim 5, wherein a second foam pad is on the plurality of substrate sets,
   wherein a sub guide panel is on the second foam pad, and
   wherein the second foam pad and the sub guide panel are on a portion of a surface of the plurality of substrate sets.

7. The backlight unit of claim 5, wherein the cover bottom includes a plurality of holes,
   wherein at least some of the plurality of holes of the cover bottom overlap the plurality of holes of the plate, and
   wherein a second fastening member is fastened in an area where a hole from the plurality of holes of the cover bottom overlaps a hole from the plurality of holes of the plate.

8. The backlight unit of claim 5, wherein the cover bottom includes a plurality of holes, and a protrusion on the plate is fastened to other holes of the plurality of holes of the cover bottom.

9. The backlight unit of claim 5, wherein each sub glass substrate included in the plurality of substrate sets is spaced apart from each other.

10. The backlight unit of claim 1, further comprising:
    a heat dissipation sheet on a rear surface of the plate.

* * * * *